United States Patent [19]

Mizutani et al.

[11] Patent Number: 5,510,892
[45] Date of Patent: Apr. 23, 1996

[54] INCLINATION DETECTING APPARATUS AND METHOD

[75] Inventors: Hideo Mizutani, Yokohama; Kesayoshi Amano; Shinji Wakamoto, both of Tokyo; Yuji Imai, Ohmiya, all of Japan

[73] Assignee: Nikon Corporation, Japan

[21] Appl. No.: 158,060

[22] Filed: Nov. 24, 1993

[30] Foreign Application Priority Data

Nov. 25, 1992 [JP] Japan ................................. 4-314837
Mar. 15, 1993 [JP] Japan ................................. 5-053450

[51] Int. Cl.⁶ .......................... G01B 11/26; G01B 11/14; G01N 21/00
[52] U.S. Cl. ................... 356/139.1; 250/559.37; 356/375; 356/400
[58] Field of Search ......................... 356/139.1, 375, 356/400; 250/561, 559.37

[56] References Cited

U.S. PATENT DOCUMENTS

| | | | |
|---|---|---|---|
| 4,477,185 | 10/1984 | Berger et al. | 356/400 |
| 4,558,949 | 12/1985 | Uehara et al. | 356/375 |
| 4,704,020 | 11/1987 | Murakami et al. | 356/139.1 |
| 4,902,900 | 2/1990 | Kamiya et al. | 250/561 |

Primary Examiner—Stephen C. Buczinski
Attorney, Agent, or Firm—Pennie & Edmonds

[57] ABSTRACT

An inclination detecting apparatus is for detecting an inclination of a front surface of a transparent wafer placed on a perpendicular to an optical axis of a projection objective in an exposure apparatus. The inclination detecting apparatus includes an illumination optical system and a condenser optical system. The illumination optical system obliquely supplies a collimated beam onto the front surface of the wafer. The condenser optical system can condense the collimated beam supplied from the illumination optical system and reflected by the wafer, and it has a quartered photodetector for receiving the reflected beam and generating a position signal corresponding to a light receiving position. The apparatus further includes a first slit plate and a second slit plate located in the illumination optical system and the condenser optical system respectively. Each of the slit plate has a plurality of slits which are arranged such that light shield portions between slits of the second slit plate can cut off the collimated beam reflected by the back surface of the wafer.

27 Claims, 16 Drawing Sheets

INCLINATION DETECTING APPARATUS AND METHOD

BACKGROUND OF THE INVENTION

1. Field of the Invention

The present invention relates to an inclination detecting apparatus and an inclination detecting method for detecting an inclination of a surface of an object to be detected relative to a certain reference plane. More particularly, the present invention relates to an inclination detecting apparatus and an inclination detecting method suitable for applications in exposure apparatus used for production of semiconductor devices and liquid crystal display devices.

2. Related Background Art

Generally, semiconductor devices, liquid crystal display devices or the like are produced by the photolithography using a reduction projection type exposure apparatus, especially using a step-and-repeat exposure apparatus or stepper, which projects an image of pattern on photomask or reticle (as will be referred to generally as "reticle") through a projection optical system onto a photosensitive substrate to effect exposure thereon. In such exposure apparatus, since the exposure pattern is very fine, the numerical aperture (NA) of the projection optical system is large and the permissible focal depth is very shallow. Therefore, in order to effect high-resolution exposure of reticle pattern image on an exposed surface of the photosensitive substrate, the exposed surface must be maintained in parallel with the best focus plane of the projection optical system within the permissible focal depth. Thus, in the case of using, for example, a wafer coated with photoresist thereon as the photosensitive substrate, conventionally, the height (position along the optical axis of projection optical system) is measured at least at three points on the wafer and the entire exposed surface of wafer is positioned approximately perpendicular to the optical axis of projection optical system.

However, if the wafer is large in scale or if the flatness of wafer itself is poor, the height detection must be conducted in a partial area on the exposed surface of wafer. Since deformation of wafer is further enhanced by exposure and chemical treatments for layers on the wafer, the inclination detection becomes indispensable in order to accurately detect an inclination of a surface in the exposed area on the wafer with respect to the image plane of projection optical system.

There are conventional inclination detecting apparatus for example as disclosed in U.S. Pat. Nos. 4,558,949 and 4,902,900, which can maintain exposed areas on the wafer respectively in the best condition by detecting an average surface inclination for each area. The apparatus as disclosed have very excellent measurement performance, by which the normality can be accurately measured relative to the optical axis of projection optical system for each exposed area on wafer in projection exposure apparatus.

There are, however, problems recognized as follows in the conventional inclination detecting apparatus as described above. If an object to be inclination-detected is a resist-coated transparent glass wafer, especially if an object is a resist-coated transparent glass wafer having a film with high reflectivity, such as aluminum, formed on the back surface thereof, light reflected from the back surface of glass wafer is mixed into light reflected from the front surface of glass wafer, which could cause a problem of error in inclination detection. Further, the reflected light from the back surface of glass wafer may be reflected by the front surface of glass wafer to return to the back surface and then to be again reflected by the back surface, which could be repeated several times between the back surface and the front surface of glass wafer, finally passing through the front surface of glass wafer to impinge on a photodetector. This could increase the error in inclination detection.

SUMMARY OF THE INVENTION

It is, therefore, a general object of the present invention to provide an inclination detecting apparatus which can accurately detect an inclination of a surface of an object by removing undesirable light reflected by the surface.

It is a more specific object of the present invention to provide an inclination detecting apparatus which can accurately detect an inclination of a surface of an object by removing light reflected by the back surface even if the object is a transparent plate, especially even if the object is a transparent plate having a film with high reflectivity on the back surface thereof.

It is another object of the present invention to provide an inclination detecting apparatus suitable for inclination detection with a variety of objects.

It is still another object of the present invention to provide an inclination detecting method for efficiently and accurately detecting an inclination of a surface of an object.

In addition, it is a further object of the present invention to provide a projection type exposure apparatus provided with an inclination detecting apparatus which can accurately detect an inclination of a surface of a transparent object.

In order to attain the above-mentioned objects, in accordance with an aspect of the present invention, we provide an inclination detecting apparatus for detecting an inclination of an object, such as a wafer, relative to a reference plane which a predetermined reference axis crosses, comprising: (a) an illumination optical system having a first optical axis obliquely set to the reference axis, the illumination optical system supplying a collimated beam onto a front surface of the object along a direction oblique to the reference axis; (b) a condenser optical system having a second optical axis arranged symmetric with the first optical axis of the illumination optical system with respect to the reference axis, the condenser optical system having condensing means for condensing the collimated beam supplied from the illumination optical system and then reflected by the front surface of the object, and light receiving means for receiving the beam condensed by the condensing means and generating a position signal corresponding to a light receiving position; (c) inclination detecting means for detecting an inclination of the front surface of the object, base on the position signal generated from the light receiving means; (d) a first light limiting means having a light-transmitting portion and a light shield portion, the first light limiting means being disposed on the first optical axis of the illumination optical system such that a conjugate image thereof is formed on the front surface of the object arranged substantially perpendicular to the reference axis; and (e) a second light limiting means having a light-transmitting portion and a light shield portion, the second light limiting means being disposed on the second optical axis of the condenser optical system such that a conjugate image thereof is formed on the front surface of the object arranged substantially perpendicular to the reference axis and that the conjugate image is substantially coincident with the conjugate image of the first light limiting means.

Specially, in case that the object is transparent, the light-transmitting portion and the light shield portion of the first light limiting means and the light-transmitting portion and the light shield portion of the second light limiting means are arranged such that the light shield portion of the second light limiting means can cut off the collimated beam reflected by the back surface of the object arranged substantially perpendicular to the reference axis.

Preferably, the first light limiting means and the second light limiting means are first and second slit plates, respectively, in which a plurality of slits are arranged as the light-transmitting portion in parallel with each other and at a predetermined pitch. Also, the slit plates each are arranged such that a longitudinal axis of the slits in each slit plate crosses an incident plane including the first optical axis of the illumination optical system and the second optical axis of the condenser optical system.

Further, advantageously, the first and second slit plates each are rotatable or swingable about a rotation axis extending in the incident plane or a rotation axis extending normal to the incident plane.

It is preferable that the inclination detecting apparatus further comprises first exchange means for exchanging the first light limiting means for a third light limiting means different in arrangement of the light-transmitting portion and the light shield portion therefrom, and second exchange means for exchanging the second light limiting means for a fourth light limiting means different in arrangement of the light-transmitting portion and the light shield portion therefrom, wherein the third and fourth light limiting means are so arranged as to remove undesirable reflected light from a surface of a object having characteristics different from those of the object to which the first and second light limiting means are applied.

Each of the first and second light limiting means may be a display which can change the light-transmitting portion and the light shield portion depending upon a voltage applied thereto.

The inclination detecting apparatus of the present invention is suitable for projection type exposure apparatus which are used for production of semiconductor devices.

Also, in accordance with another aspect of the present invention, we provide an inclination detecting method for detecting an inclination of a front surface of a transparent object, using an optical apparatus provided with the inclination detecting apparatus of the present invention and an optical position detecting apparatus for detecting a position of the front surface of the object in a direction parallel to the reference axis; the inclination detecting method comprising: (a) a step of detecting a position of the front surface of the object in the direction parallel to the reference axis, using the position detecting apparatus; (b) a step of moving the front surface of the object to a reference position in a first direction for measuring an inclination of the front surface of the object by the inclination detecting apparatus, based on a result of detection by the position detecting apparatus; and (c) a step of detecting an inclination of the front surface of the object, using the inclination detecting apparatus, in the state in which the front surface of the object is set at a reference position.

The present invention will become more fully understood from the detailed description given hereinbelow and the accompanying drawings which are given by way of illustration only, and thus are not to be considered as limiting the present invention.

BRIEF DESCRIPTION OF THE DRAWINGS

In the course of the following detailed description, reference will be made to the attached drawings in which.

DETAILED DESCRIPTION OF THE PREFERRED EMBODIMENTS

In the following description, like references characters designate like or corresponding parts throughout the several views.

Figure 1:
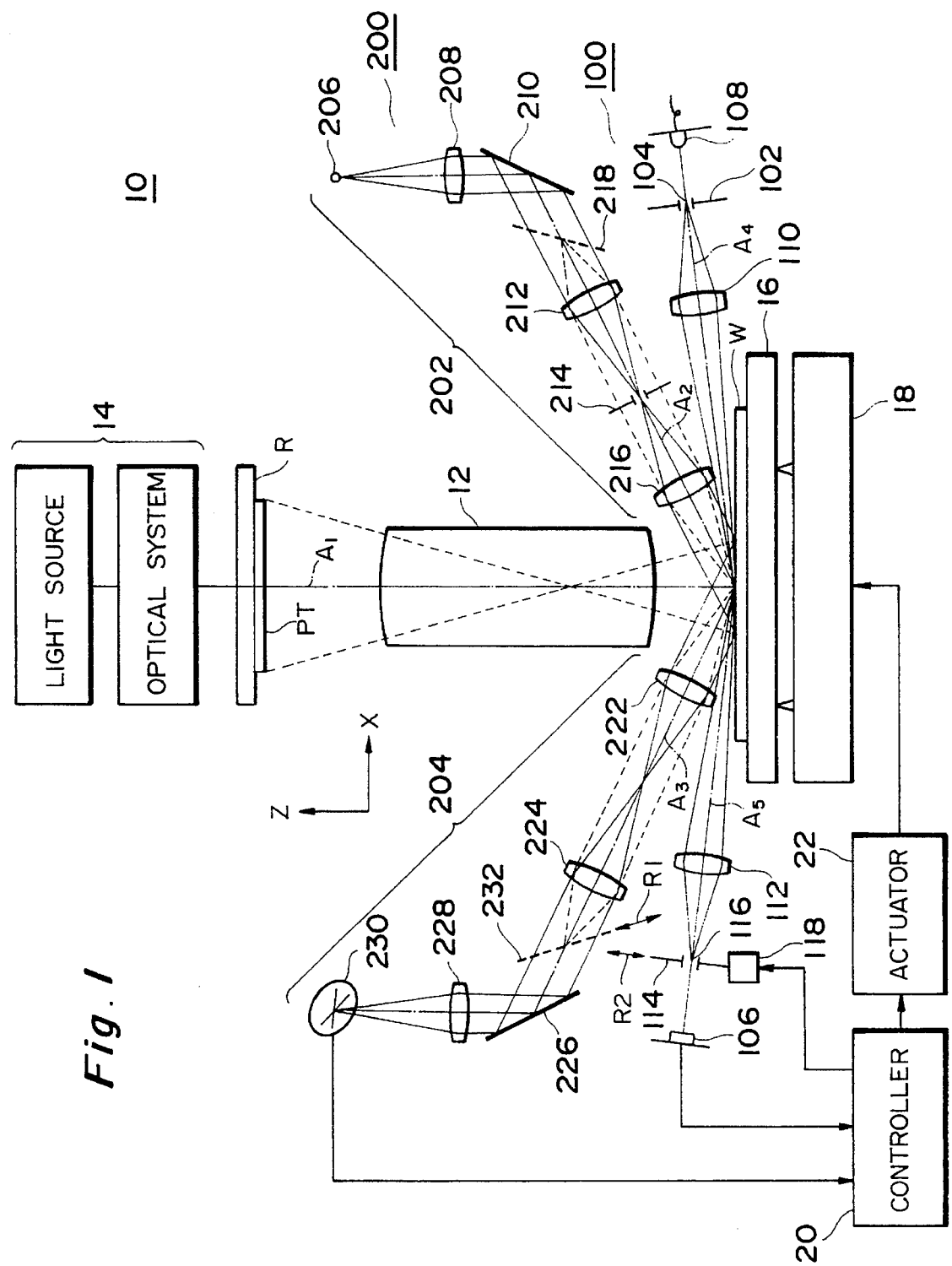
FIG. 1 schematically shows a first embodiment of the present invention.

FIG. 1 schematically shows optical paths in a reduction projection type exposure apparatus 10 provided with an inclination detecting apparatus according to the present invention. In the reduction projection type exposure apparatus 10, a surface of reticle R on which pattern PT is formed is conjugate with a front surface (exposed surface) of wafer W as an object to be measured, with respect to a projection optical system or projection objective 12, which is both-side or single-side telecentric, so that the pattern PT on reticle R illuminated by exposure light from an illumination optical system 14 is reduction-projected onto the front surface of wafer W. The wafer W employed in this embodiment is a transparent glass wafer, the front surface or upper surface of which is coated with a photoresist as photosensitive material. The wafer W is held on a wafer holder 16 and the wafer holder 16 is mounted on a wafer stage 18. The wafer stage 18 is provided with an XY stage for moving the wafer holder 16 in a plane (XY plane or horizontal plane) perpendicular to the optical axis $A_1$ of the projection objective 12, a Z stage for moving the wafer holder 16 in the Z direction (in the vertical direction) parallel to the optical axis $A_1$ of projection objective 12, and a leveling stage for setting the front surface of wafer W held by the wafer holder 16 in parallel with the best focus plane of the projection objective 12, which are not shown in FIG. 1. An example of the leveling stage is so arranged that three support points are provided at equal intervals near the periphery of wafer holder 16 and that the inclination of wafer W on wafer holder 16 is adjusted by changing a projection amount of each support point along the Z direction.

A controller 20 is connected to the wafer stage 18 through an actuator 22 for actuating the wafer stage 18 to control the operation of wafer stage 18. In actual print-exposure of pattern PT onto the wafer W, exposure is repetitively carried out every time the wafer W is moved by a certain amount in the X direction and/or in the Y direction, according to the step-and-repeat method. The same steps are repeated exchanging reticles with different patterns.

The exposure apparatus 10 is also provided with an autofocus mechanism. The autofocus mechanism has an optical focus position detecting apparatus 100 which optically detects a position of wafer W in the Z direction thereby to detect whether the front surface of wafer W is substantially coincident with the best focus plane of projection objective 12. The focus position detecting apparatus 100 employs a method in which an image of slit 104 in a slit plate 102 is obliquely projected onto the front surface of wafer W and focused thereon, and in which a reflected image is received by a photodetector 106 in an optical system on the opposite side. Signals from the photodetector 106 are supplied to the controller 20 and then the controller 20 calculates the Z position of wafer W, with which the controller adjusts the position of Z stage in wafer stage 18 so that the front surface of wafer W becomes coincident with the best focus plane of projection objective 12. More details of the focus position detecting apparatus itself are disclosed in U.S. Pat. No. 4,650,983, and are incorporated by reference herein.

Further, the exposure apparatus 10 is provided with an inclination detecting apparatus 200 for detecting an inclination (normally the degree of horizontalness) of the surface of wafer W in the exposure area relative to the best focus plane of projection objective 12. The inclination detecting apparatus 200 has an illumination optical system 202 and a condenser optical system 204. Optical axes $A_2$, $A_3$ of these optical systems 202, 204 are symmetric with each other with respect to the optical axis $A_1$ of projection objective 12 while the optical axes $A_1$, $A_2$, $A_3$ are intersecting with each other at a point. Accordingly, an illumination region illuminated by a light beam guided from the illumination optical system 202 onto the front surface of wafer W is almost coincident with the exposure area of projection objective 12 on the wafer W. Also, a plane including the optical axes $A_1$, $A_2$, $A_3$ of the optical systems is parallel to the X direction.

Figure 2:
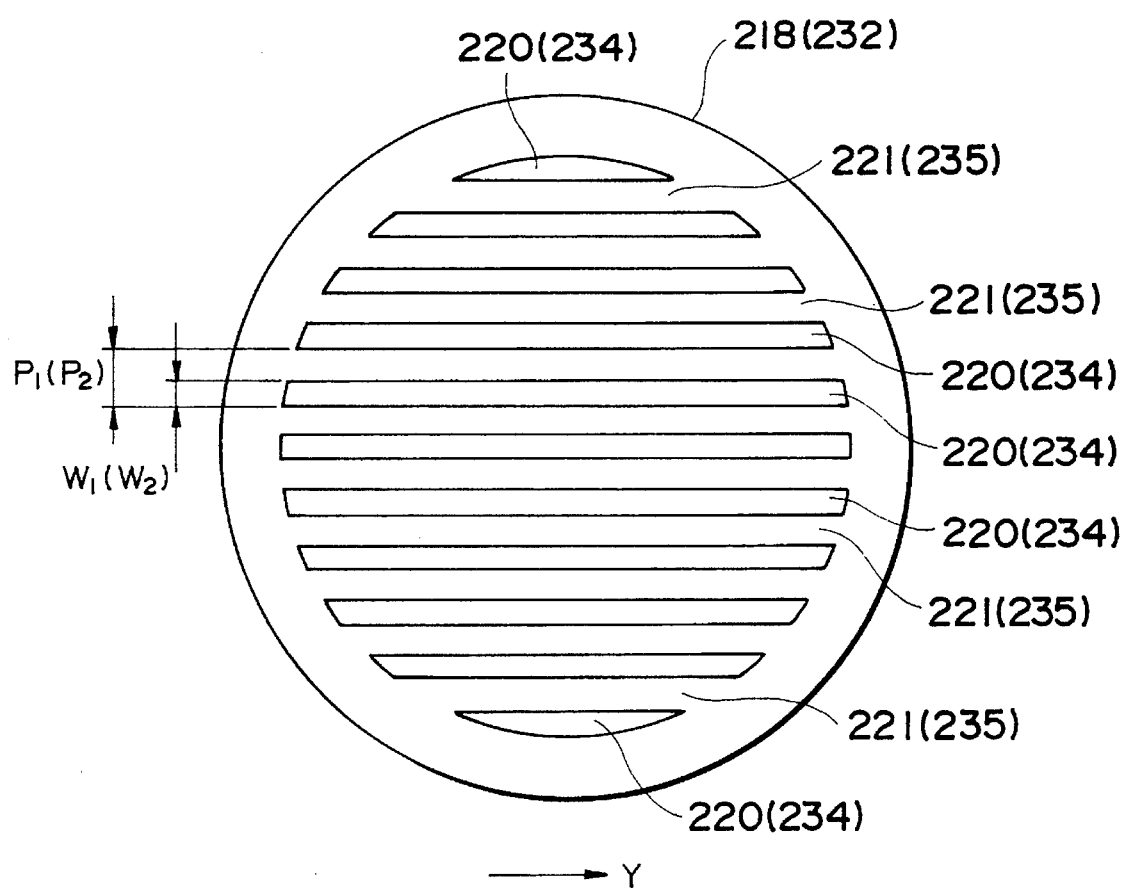
FIG. 2 is a plan view showing a slit plate used in the embodiment shown in FIG. 1.

The illumination optical system 202 has a light source 206, and further a collimator lens 208, a mirror 210, a condenser lens 212, an aperture stop 214 having a fine circular aperture, and an illumination objective 216 which are arranged in the named order along the optical path of detection light from the light source 206. In the illumination optical system 202, light from the light source 206 is converted into a beam of parallel rays by the collimator lens 208, the beam of parallel rays is guided through the mirror 210 to the condenser lens 212, and the condenser lens 212 focuses the beam of parallel rays to form an image of light source 206 on the fine aperture in the stop 214. The illumination objective 216 has a focal point on the fine aperture in stop 214, so that the objective 216 converts a diverging beam from the fine aperture into a beam of parallel rays impinging on the wafer W. Further, a first slit plate 218 of disk having a plurality of slits 220 as shown in FIG. 2 is disposed between the mirror 210 and the condenser lens 212 in the present embodiment.

The longitudinal direction of the slits 220 is perpendicular to the incident plane (the plane of FIG. 1) including the optical axis $A_2$ of illumination optical system 202 and the optical axis $A_3$ of condenser optical system 204. The slits 220 have a same width $W_1$ and are arranged in parallel with each other at constant pitch $P_1$. The light supplied from the illumination optical system 202 is light with a different wavelength from the exposure light illuminating the reticle R to prevent the resist on wafer W from being affected or exposed.

The setting plane of the first slit plate 218 is conjugate with the front surface of wafer W with respect to the image-forming optical system composed of the condenser lens 212 and the illumination objective 216. In this case, since the front surface of wafer W is not perpendicular to the optical axis $A_2$, the first slit plate 218 is also obliquely set relative to the optical axis $A_2$. The first slit plate 218 and the front surface of wafer W are set in a so-called tilting arrangement based on the Scheimpflug principle.

Figure 3:
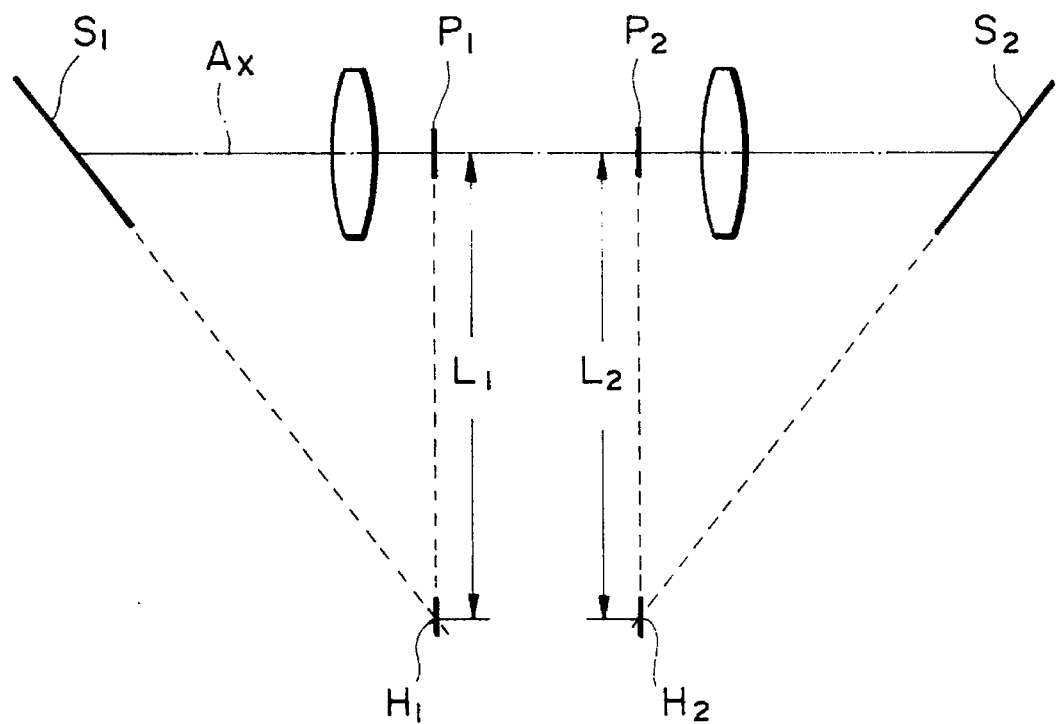
FIG. 3 is an explanatory drawing to illustrate the Scheimpflug principle.

To explain schematically, the so-called tilting arrangement based on the Scheimpflug principle is an arrangement in which three planes of object plane, image plane and principal plane of image-forming optical system intersect with each other on a single straight line. More accurately expressing, for example with an image-forming optical system focusing a pattern on a surface $S_1$, on a surface $S_2$ as shown in FIG. 3, that the surface $S_1$ and the surface $S_2$ are set in the arrangement according to the Scheimpflug principle means that if, in a meridional cross section of the image-forming optical system, $H_1$ is an intersection between extension of the surface $S_1$ and the object-side principal plane $P_1$ of the image-forming optical system and $H_2$ is an intersection between extension of the surface $S_2$ and the image-side principal plane $P_2$, distance $L_1$ from the intersection $H_1$ to the optical axis Ax is equal to distance $L_2$ from the intersection $H_2$ to the optical axis Ax. In this arrangement, a beam coming from an arbitrary point on the surface $S_1$ is focused at a corresponding point on the surface $S_2$. Thus, since the object distance and the image distance are different between the conjugate surfaces, it cannot be avoided that the image magnification varies depending upon the location on the surface, but an image of pattern on the surface $S_1$ can be clearly formed on the surface $S_2$. Accordingly, images of the slits 220 in the first slit plate 218 are clearly formed in the exposure area on the wafer W in the embodiment shown in FIG. 1.

On the other hand, the condenser optical system 204 has a condensing objective 222, a collimator lens 224, a mirror 226, a condenser lens 228 and a quartered photodetector 230, which are arranged in the named order along the optical path of light reflected by the front surface of wafer W. The beam supplied from the illumination optical system 204 and then reflected by the front surface of wafer W is focused at the focal position of the condensing objective 222 by the condensing objective 222. After-that, the beam is collimated by the collimator lens 224 into a beam of parallel rays, and the collimated beam is focused by the condenser lens 228 on the quartered photodetector 230 provided at the rear focal position thereof.

Also, a second slit plate 232 is disposed between the collimator lens 224 and the mirror 226 in the condenser optical system 204. This position is conjugate with the front surface of wafer W as an object to be detected, and further in turn with the first slit plate 218 in the illumination optical system 202. The second slit plate 232 has a plurality of slits 234 like the first slit plate 218 as shaped as shown in FIG. 2. The longitudinal direction of the slits 234 is also perpendicular to the incident plane. Further, the second slit plate 232 and the front surface of wafer W are set in the arrangement based on the Scheimpflug principle in the same manner as the first slit plate 218.

In FIG. 1, the solid lines represent rays showing the conjugate relation with the light source 206, and the broken lines rays showing the conjugate relation with the slit plates 218, 232 and the front surface of wafer W. As shown by the solid lines in FIG. 1, the beam illuminating the front surface of wafer W is a beam of parallel rays and the first slit plate 218 is located in the beam of parallel rays. Thus, the projection system for the first slit plate 218 in the illumination optical system 202 is both-side telecentric on the object side and on the image side. Similarly, the second slit plate 232, which is arranged conjugate with the front surface of wafer W in the condenser optical system 204, is also both-side telecentric. Therefore, although the first slit plate 218 and the second slit plate 232 are obliquely set relative to the optical axes $A_2$ and $A_3$ of the optical systems 202, 204 in the so-called tilting arrangement based on the Scheimpflug principle, no partial magnification difference is caused in a projected image of slit plate 218 on the front surface of wafer W, strictly maintaining the constant spacing (pitch) of the slits 220 in the slit plate 218 constant also on the front surface of wafer W.

Figure 4:
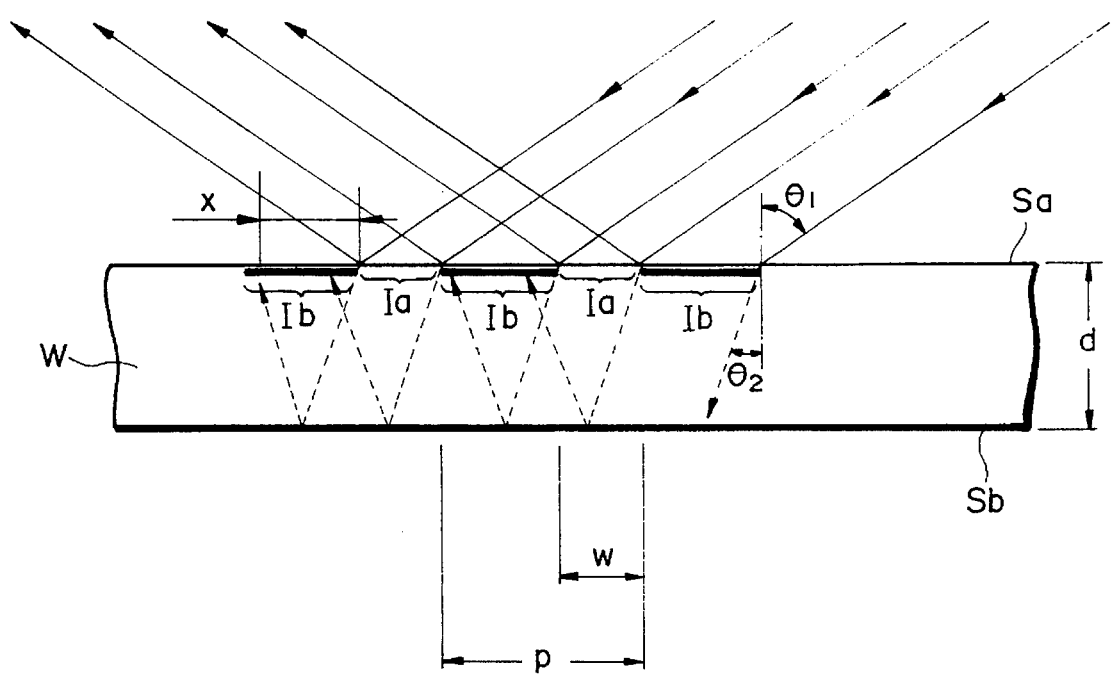
FIG. 4 schematically shows optical paths in a transparent object or wafer.

Here, the structure and operation of the first slit plate 218 and the second slit plate. 232 are described in more detail also referring to FIG. 4.

If the wafer W is a transparent plate such as glass, light from the light source 206 inevitably produces reflected light from the lower surface or back surface Sb of wafer W. The reflected light from the back surface Sb can be removed by provision of the first slit plate 218 and the second slit plate 232. For that purpose, in the condition that the slits 220, 234 in the first slit plate 218 and in the second slit 232 are projected onto the wafer W, it is necessary to determine the pitch p of images of slits 220, 234 and the width w of the slit images in the following relation.

FIG. 4 is a ray diagram to illustrate how the parallel rays reaching the wafer W are reflected on the front surface Sa and on the back surface Sb of wafer W as object, together with the image of first slit plate 218 projected onto the front surface of wafer W. In FIG. 4, the solid lines represent rays reflected by the front surface Sa of wafer W and the broken lines represent rays reflected by the back surface Sb. FIG. 4 shows the relation between the first slit plate 218 projected by the illumination optical system 202 and the second slit plate 232 provided in the condenser optical system 204, as a combination thereof at the conjugate position on the wafer W.

In an arrangement according to the present invention, among the plural slit images projected by the illumination optical system 202, only light reflected by the front surface Sa of wafer W can pass through the slits 234 in the second slit plate 232 provided in the condenser optical system 204. Specifically, in FIG. 4, portions Ia correspond to the slits 220 in the first slit plate 218 and to the slits 234 in the second slit plate 232, while portions Ib to the light shield portions 221 in the first slit plate 218 and to the light shield portions 235 in the second slit plate 232. As shown in FIG. 4, the first and second slit plates are arranged such that the light (represented by the broken lines) reflected by the back surface Sb of wafer W is shut out by the portions Ib, that is, by the light shield portions 235 in the second slit plate 232.

From the well-known law of refraction, the following relation is obtained.

$$\sin\theta_1 = n\sin\theta_2 \tag{1}$$

where $\theta_1$ is an incident angle of the light supplied to the front surface Sa of wafer W by the illumination optical system 202, $\theta_2$ is an angle of refraction in the wafer W, d is the thickness of wafer W, and n is an index of refraction. In addition, the following equation provides an amount of horizontal difference between the light reflected by the front surface Sa of wafer W and the light reflected by the back surface Sb, which is a deviation amount x of the back-face-reflected light because of the back face reflection in the wafer W.

$$x = 2d\tan\theta_2 \tag{2}$$

Further, the following two relations must be satisfied among the deviation amount x of the light reflected by the back surface Sb, the width w of each portion Ia and the pitch p of the portions Ia on the wafer W.

$$x + w \leq p \tag{3}$$

$$w < x \tag{4}$$

Combining the above relations, the following condition is obtained.

$$w < x \leq p - w \tag{5}$$

This relation must be satisfied.

Incidentally, although the pitch p and the width w for the slit images on the front surface Sa of wafer W can be determined arbitrarily within the range satisfying the above relation, they should be preferably set to proper values taking into account the variation range of thickness of wafer W. It is apparent from the above relation that the width w must be set within a half of pitch p.

Since the bright portions Ia correspond to the slits 220 in the first slit plate 218, a ratio (w/p) between the width w of and pitch p of bright portions Ia will be referred to as "opening rate" of slit plate 218. If w=p/2 is employed to maximize the opening rate (w/p), the thickness d of wafer satisfying the above relation of Equation (5) is limited only to a single value as defined by the following equation.

$$d = p/(4\tan\theta_2) \tag{6}$$

This is very inconvenient in case of variations of thickness of wafer W or in case of wafers having different thicknesses. Therefore, the opening rate must be set smaller than 50%. Setting the opening rate below 50%, wafers having thickness d within a certain range can be dealt with. Considering the quantity of light, the opening rate is normally set between 10% and 50%, preferably between 40% and 50%.

For example, in case that the index of refraction of wafer W is n=1.50, that the incident angle of the collimated beam through the illumination optical system 202 into the wafer W is $\theta_1=60°$, that the pitch of slit images on the wafer W is 3 mm, and that the width w of each slit image Ia is 1 mm, the horizontal deviation must be within the following range from the above relation of Equation (5).

1 mm<x<2 mm

Then the thickness d of wafer W must be within the following range from the above relation of Equation (2).

0.7 mm<d<1.4 mm

This range can satisfy the above condition.

As described above, the values of plural slit images on the wafer W can be used to determine the pitch $p_1$ of slits 220 and the slit width $w_1$ for the first slit plate 218 in the illumination optical system and the pitch $P_2$ of slits 234 and the slit width $w_2$ for the second slit plate 232 in the condenser optical system 204. Namely, each value for the slits 220, 234 in the first slit plate 218 and the second slit plate 232 may be obtained as a product of a corresponding value on the wafer W with an inverse of projection magnification onto the wafer W. Thus, in case that the first slit plate 218 and the second slit plate 232 are in 1:1 conjugate relation with each other through the reflection on the front surface Sa of wafer W, the two slit plates 218, 232 have the same shape and the same number of same slits. That is, $p_1=p_2$ and $w_1=w_2$.

In case that the conjugate relation between the first slit plate 218 and the second slit plate 232 is not 1:1, the relation should be of $p_1:p_2=w_1:w_2$.

In a practical arrangement, the first slit plate 218 is projected at magnification of ½ onto the front surface Sa of wafer W and the second slit plate 232 is in conjugate relation of ½ magnification with the front surface Sa of wafer W. In this case, the values of slits 220, 234 on the both slit plates 218, 232 each are a double of a value on the wafer W. Namely, $p_1=p_2=2p$ and $w_1=w_2=2w$.

The above arrangement can satisfactorily remove the light reflected by the back surface, which is inevitably caused in case of a transparent wafer W being an object. Since the optical axis $A_2$ of illumination optical system 202 is arranged symmetric with the optical axis $A_3$ of condenser optical system 202 with respect to the optical axis $A_1$ of projection objective 12, the beam from the illumination optical system 202 is focused at the central position of the quartered photodetector 230 as long as the exposure area in the front surface of wafer W is kept perpendicular to the optical axis $A_1$ of projection objective 12. If the exposure area in the front surface of wafer W is inclined at an angle $\alpha$ to the vertical line, the collimated beam coming from the illumination optical system 202 and then reflected by the wafer W is inclined at an angle $2\alpha$ relative to the optical axis $A_3$ of condenser optical system 204, being focused at a position offset from the center on the quartered photodetector 230. An inclination direction of exposure area on the wafer W is detected from the position of the focused point on the quartered photodetector 230. The controller 20 generates a control signal according to the displacement direction and displacement amount of the focus point on the quartered photodetector 230 so that the actuator 22 actuates the wafer stage 18 to move the wafer holder 16 with the wafer W mounted thereon and to correct the inclination of surface of exposure area on the wafer W.

Further, the inclination detection is carried out in a partial area on the surface of wafer W which is illuminated by the illumination optical system 202, and the illuminated area on the wafer W is set in the almost same size as the exposure area by the projection objective 12, whereby the exposure area can be automatically set at an accurate position in average as being perpendicular to the optical axis $A_1$ of the projection objective 12.

In the arrangement of the embodiment shown in FIG. 1, the first slit plate 218 projected by the illumination optical system 202 and the second slit plate 232 provided in the condenser optical system 204 both are both-side telecentric in respect of image formation, as described above, so that slit images of constant pitch can be accurately projected without producing a partial magnification difference even in the tilting arrangement. Since there is a certain permissible range in actual applications, as described about the pitch of slit images and the slit image width on the front surface of wafer W, the both-side telecentricity is not always necessary for the first slit plate 218 and the second slit plate 232. However, the telecentricity is necessary on the wafer W side, because the beam must be collimated on the wafer W side.

Also, although the above example is so arranged that the first and second slit plates 218, 232 are set in the so-called tilting arrangement based on the Scheimpflug principle, the slit plates 218, 232 can be arranged perpendicular to the optical axes $A_2$, $A_3$, respectively, if the light source 206 is sufficiently small in size to provide a sufficient depth of focus. In this case, there is no difference in magnification caused between the periphery and the center of image even without telecentricity on the slit plate side (object side), though the image of each slit plate is somewhat out of focus at the periphery thereof on the front surface of wafer W. Accordingly, if the out-of-focus or unsharpness amount at the periphery, depending upon the size of projected area of each slit plate on the front surface of wafer W, that is, depending upon the size of area where the image of reticle R is reduction-projected by the projection objective 12, is acceptable, the change of pitch of slit images in each slit plate can be decreased as smaller than in the tilting arrangement.

Figure 5:
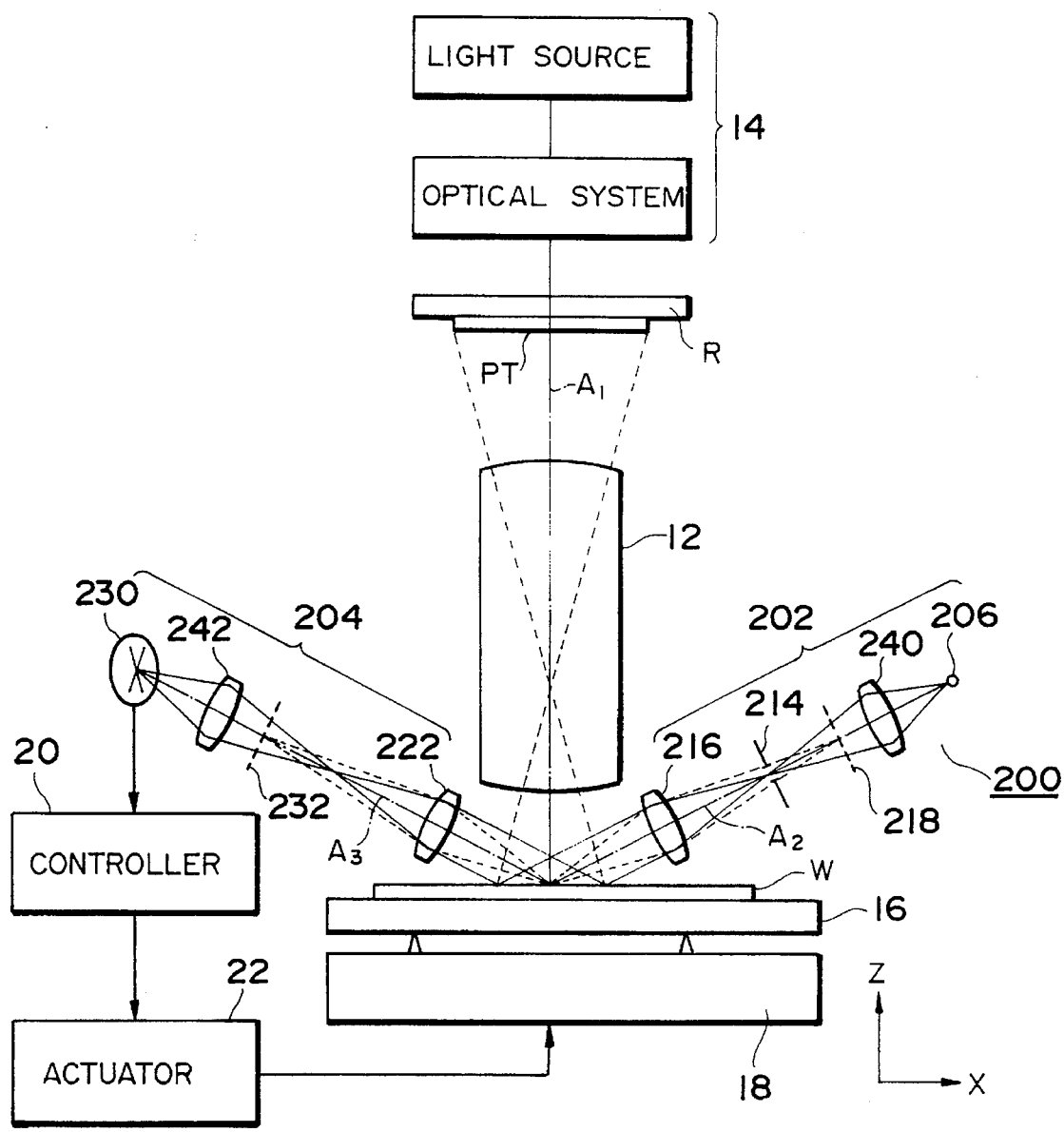
FIG. 5 schematically shows a second embodiment of the present invention.

FIG. 5 schematically shows the structure of another embodiment of inclination detecting apparatus according to the present invention, in which the focus position detecting apparatus is omitted to show. In FIG. 5 elements having functions identical to those of the elements shown in FIG. 1 are denoted by the same reference numerals. In the present embodiment, each system is telecentric only on the side of wafer W but not telecentric on the side of each slit plate 218, 232 in respect of image-forming relation of the first slit plate 218 and the second slit plate 232 disposed in the illumination optical system 202 and in the condenser optical system 204, respectively, and the slit plates are perpendicular to the optical axes $A_2$, $A_3$. In more detail, in the illumination optical system 202, a beam from the light source 206 is focused by a condenser lens 240 on a fine aperture in the stop 214, and the first slit plate 218 is disposed in a converging beam condensed through the condenser lens 240. The slit plate 218 is located at a position conjugate with the front surface of wafer W with respect to the illumination objective 216. Further, in the condenser optical system 204, the beam from the focused point by the condenser objective 222 is focused by a condenser lens 242 on the photodetector 230, and the second slit plate 232 is located in a diverging beam going into the condenser lens 242. The second slit plate 232 is located at a position conjugate with the front surface of wafer W with respect to the condenser objective 222. The other part of structure is substantially the same as that as described with FIG. 1.

In such an arrangement, since the first slit plate 218 and the second slit plate 232 are perpendicular to the respective optical axes $A_2$, $A_3$, the images of slits of constant pitch are formed on the front surface of wafer W at almost constant pitch in each conjugate relation with the front surface of wafer W, and unsharpness at the periphery of projected image can be substantially ignored by decreasing the size of the light source 206. This embodiment can also satisfactorily remove the light reflected by the back surface of the transparent glass wafer W, similarly as described with FIG. 4. Strictly speaking, an image of each slit plate 218, 232 on the front surface of wafer W is perpendicular to each of the optical axes $A_2$, $A_3$ but is not parallel with the front surface of wafer W as shown in FIG. 4. However, if the size of light source 206 is made smaller to increase the depth of focus, the structure can be assumed substantially same as that in FIG. 4. Further, the structure of the present embodiment is also the same as that in the embodiment of FIG. 1 in that the controller 20 controls the actuator 22 to move the wafer stage 18 so as to locate the wafer W at the best position, based on the output from the photodetector 230.

The embodiments as shown in FIGS. 1 and 5 show examples in which among light reflected by the back surface of wafer W only once-reflected light is cut off. However, if there is a film with high reflectivity such as aluminum on the back surface of wafer W, twice-reflected light still has a high intensity, which is desired to be also cut off in some cases. To cut off such once-reflected and twice-reflected light, it is necessary to determine the width of each slit image and the pitch of slit images formed on the front surface of wafer W in the following relation. Normally, thrice-reflected light has a low intensity, which does not affect the inclination detection.

Figure 6:
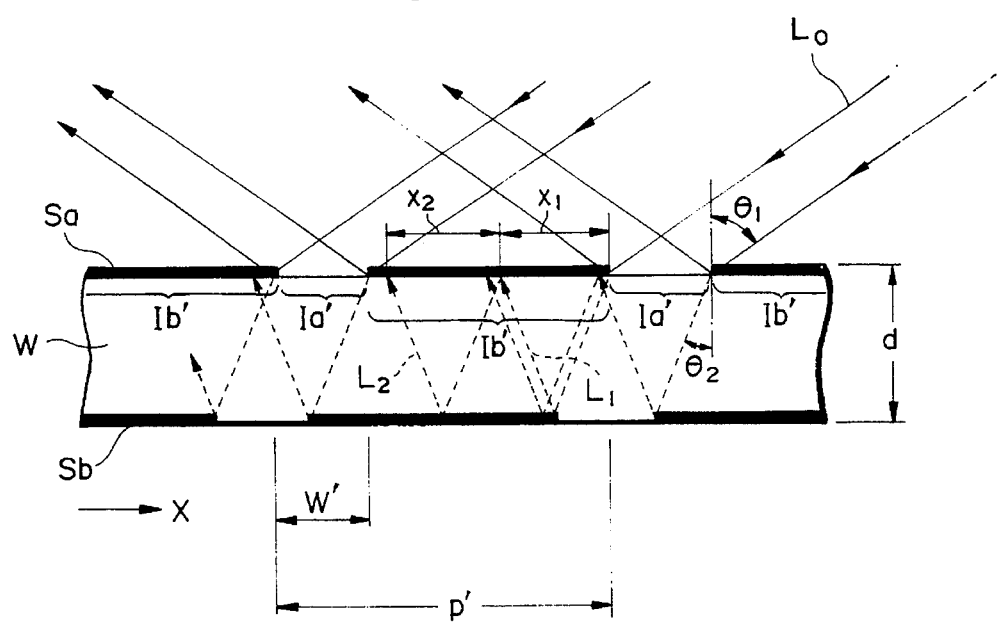
FIG. 6 schematically shows optical paths in a transparent object or wafer together with optical paths of twice-reflected light by the back surface of wafer.
Figure 7:
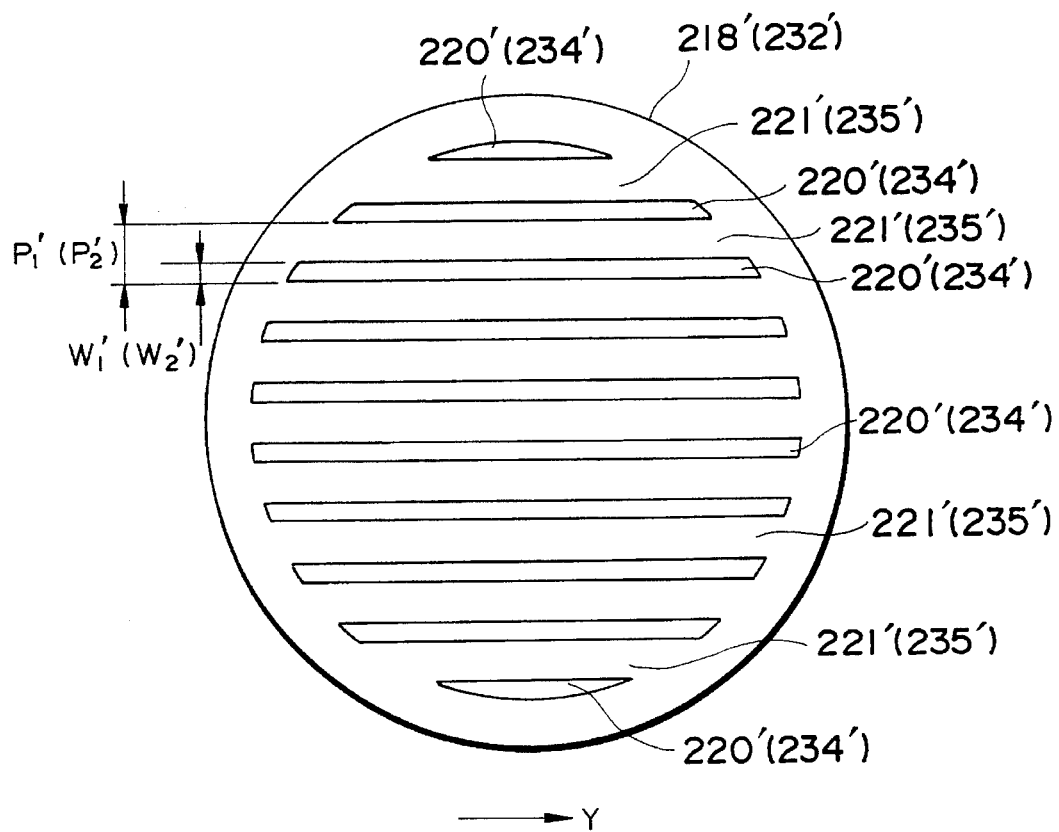
FIG. 7 is a plan view showing a slit plate for removing once-reflected and twice-reflected light by the back surface.

FIG. 6 is a drawing similar to FIG. 4, which is a ray diagram in such an arrangement that a first slit plate 218' and a second slit plate 232' are placed at the positions of the first and second slit plates 218, 232, respectively, in the inclination detecting apparatus 200 shown in FIG. 1 in order to cut off the once-reflected and twice-reflected light from the back surface Sb of glass wafer W. Also, FIG. 7 is a plan view to show the structure of the first slit plate 218' and the second slit plate 232'. In FIG. 6, the solid lines represent optical paths of rays reflected upward by the front surface Sa of wafer W and the broken lines represent optical paths of rays reflected by the back surface Sb. An image of the first slit plate 218' focused on the front surface Sa of wafer W is composed of portions Ia', which are arranged in width w and at pitch p' in the direction (X direction) parallel to the plane of FIG. 6, and portions Ib'. Also, in FIG. 6, a conjugate image of the second slit plate 232', which is provided in the condenser optical system, on the front surface Sa of wafer W is almost coincident with the image of the first slit plate 218'.

Referring also to FIG. 1, among the image-forming beam from the image of first slit plate 218' projected by the illumination optical system 202, only the light reflected by the front surface Sa of wafer W can pass through the slits 234' in the second slit plate 232' disposed in the condenser optical system 202 in the present embodiment. Specifically, in FIG. 6, bright portions Ia' in the image correspond to the slits 220' in the first slit plate 218' and dark portions Ib' in the image to the light shield portions 221' in the first slit plate 218'. The first and second slit plates 218', 232' are located as shown in FIG. 6 such that the light reflected by the back surface Sb of wafer W is cut off by the dark portions Ib', that is, by the light shield portions 235' in the second slit plate 232'.

From the well-known law of refraction, the following equation stands in FIG. 6.

$$\sin\theta_1 = n\sin\theta_2 \tag{7}$$

Where $\theta_1$ is an incident angle of light $L_0$ supplied from the illumination optical system 202 in FIG. 1 to the front surface Sa of wafer W, $\theta_2$ an angle of refraction of the light $L_0$ in the wafer W, d the thickness of wafer W, and n an index of refraction of wafer W. Then the following equation provides an amount of horizontal difference in the X direction between the light reflected by the front surface Sa of wafer W and the light reflected by the back surface Sb, which is a deviation amount x of the back-surface-reflected light due to the back reflection in the wafer W.

$$x = 2d\tan\theta_2 \tag{8}$$

Letting $x_1$ be an amount of horizontal shift of the reflected light $L_1$ due to the first reflection on the back surface Sb and $x_2$ be an amount of horizontal shift of the reflected light $L_2$ due to second reflection on the back surface Sb, the following relation holds, because the thickness d of wafer W is constant.

$$x_1 = x_2 (= x) \tag{9}$$

As apparent from FIG. 6, the following two relations must be satisfied as to the width w' and the pitch p' of the bright portions Ia' in the image of slit plate 218' on the wafer W.

$$2x + w' < p' \tag{10}$$

$$w' < x \tag{11}$$

The following relation is obtained by combining the above two relations of Equations (10) and (11).

$$w' < x < (p' - w')/2 \tag{12}$$

Therefore, the width w' and the pitch p' of the bright portions Ia' in the image of first slit plate 218' on the wafer W must satisfy this relation.

Incidentally, although the pitch p' of slit images and the width w' of bright portions Ia' on the front surface Sa of wafer W can be arbitrarily selected within the range satisfying the relation of Equation (12), they may be preferably set to appropriate values, taking into account the fluctuation range of thickness d of wafer W. It is clear from the above relation that the width w' of bright portions Ia' cannot exceed one third of the pitch p'. Since the bright-portions Ia' correspond to the slits 220' in the first slit plate 218', a ratio (w'/p') between the width w' of each bright portion Ia' and the pitch p' of the bright portions Ia will be referred to as "opening rate" of slit plate 218'.

If w'=p'/3 is selected to maximize the opening rate (w'/p'), the thickness d of wafer W is limited only to the following single value satisfying the above relation of Equation (12).

$$d = p'/(6\tan\theta_2) \tag{13}$$

This is very inconvenient in case of a wafer W having variations of thickness or in case of wafers W having different thicknesses. Thus, the opening rate must be set smaller than ⅓. Setting the opening rate smaller than ⅓, the apparatus can handle wafers in a certain range of thickness d. Considering the quantity of light, the opening rate (w'/p') is preferably set between 20% and 30%.

For example, if the index of refraction n of wafer W is 1.50, the incident angle $\theta_1$ of the collimated beam illuminating the wafer W through the illumination optical system 202 is 60°, the pitch p' of the image of first slit plate 218' on the wafer W is 4 mm, and the width w' of the bright portions Ia', which are images of slits 220', is 1 mm, the following range is obtained for x from the above relation of Equation (11).

1 mm<x<1.5 mm

Substituting this into Equation (8), the range of thickness d of wafer W is determined as follows.

0.7 mm<d<1.4 mm

This range can satisfy the above condition accordingly. Then, using the pitch p' of slit images and the width w' of each of bright portions Ia' on the front surface Sa of wafer W, the pitch $p_1'$ and the width $w_1'$ of slits 220' are determined for the first slit plate 218' in the illumination optical system 202, and the pitch $P_2'$ and the width $w_2'$ of slits 234' for the second slit plate 232' in the condenser optical system 204. Namely, values of pitch and width of slits 220', 234' in the first slit plate 218' and in the second slit plate 232' are given by products of the respective values about the image projected onto the wafer W with an inverse of projection magnification on the front surface Sa of wafer W. In case that the first slit plate 218' and the second slit plate 232' is in 1:1 conjugate relation with each other through the reflection on the front surface Sa of wafer W, the both slit plates have the same shape and a plurality of same slits, which have the same pitch and the same width as follows.

$p_1'=p_2'$ and $w_1'=w_2'$

Also, in case that the first slit plate 218' and the second slit plate 232' are not in the 1:1 conjugate relation with each other, the pitch and width of one slit is proportional to those of the other.

It will be understood from the above-mentioned that, by properly setting the pitches and widths of slits in the first and second slit plates, twice-reflected or even more-reflected light on the back surface of transparent wafer W can be cut off as well as the once-reflected light. Nevertheless, if the slit plates are arranged to be fixed on respective mounts, exchange of slit plates depending upon characteristics of wafer W is troublesome for example from the slit plates 218, 232 to the slit plates 218', 232' (or otherwise).

Figure 8:
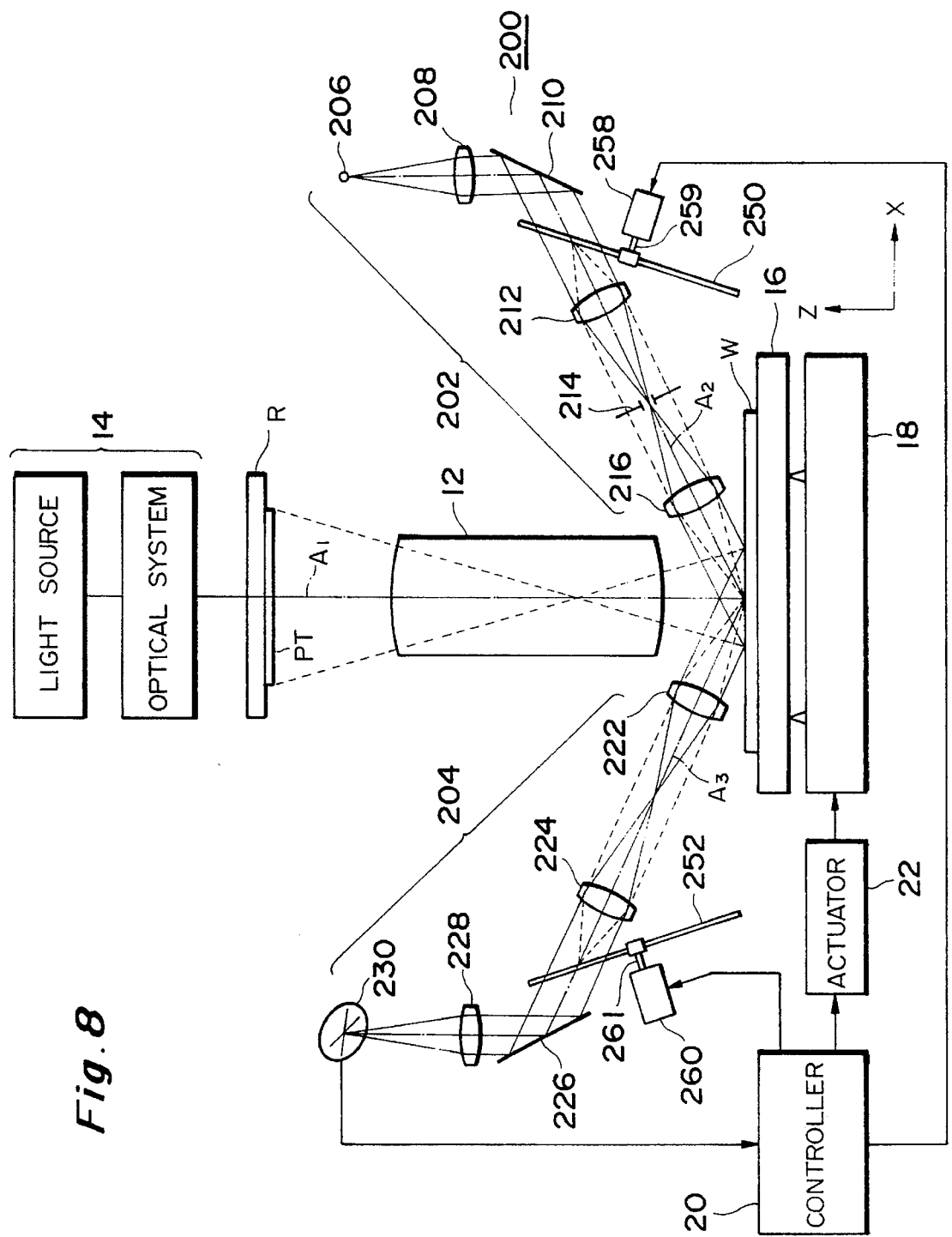
FIG. 8 schematically shows a third embodiment of the present invention.

This problem will be solved by such an arrangement that first and second rotatable selection plates 250, 252 each having a plurality of slit plates are placed at the locations of the first slit plate 218 or 218' and the second slit plate 232 or 232', as shown in FIG. 8. The structure of FIG. 8 is substantially the same as that of FIG. 1 except that the first slit plate 218 and the second slit plate 232 are replaced by a first selection plate 250 and a second selection plate 252. Also, in FIG. 8, the focus position detecting apparatus is omitted to show.

Figure 9:
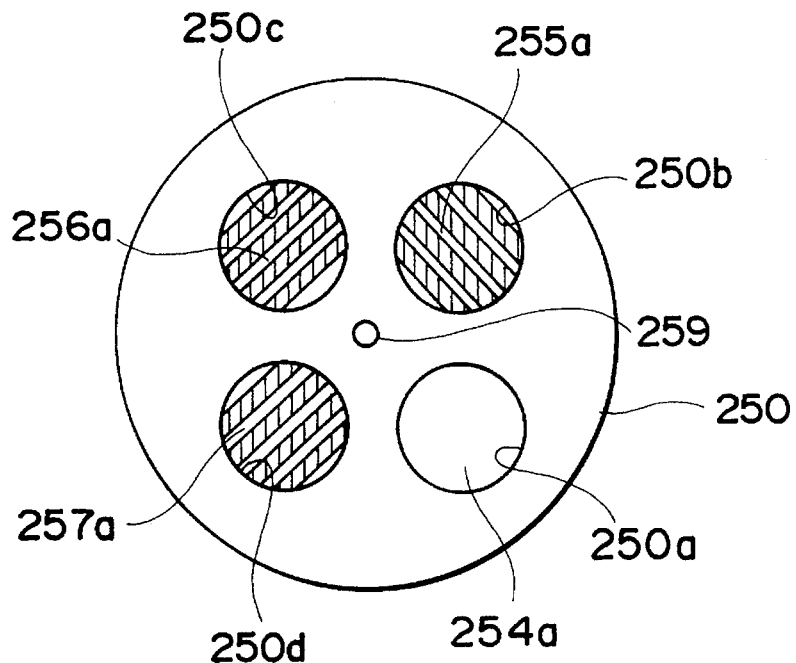
FIG. 9 is a plan view showing a first selection plate used in the embodiment shown in FIG. 8.
Figure 10:
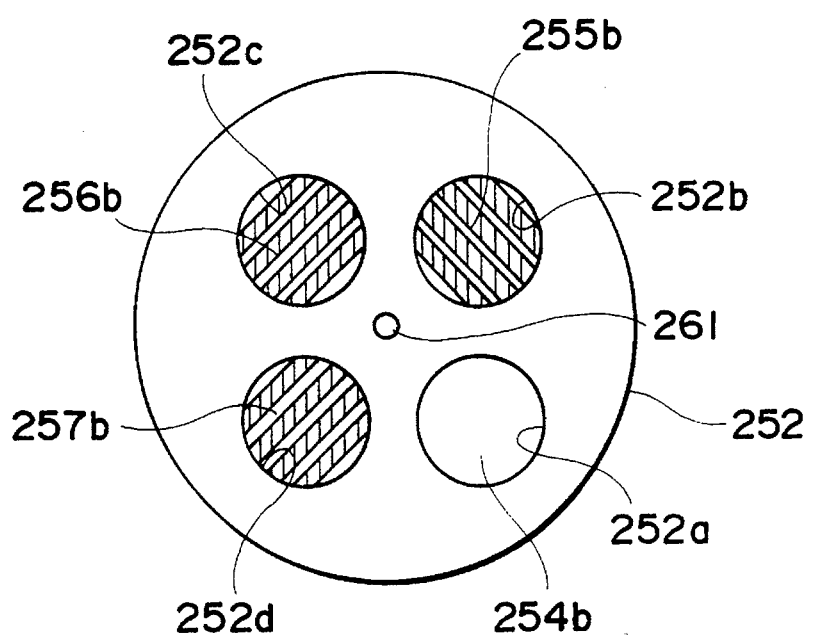
FIG. 10 is a plan view showing a second selection plate used in the embodiment shown in FIG. 8.

Each of the first and second selection plates 250, 252 is of a disk and has apertures formed at equal intervals in the circumferential direction, as shown in FIG. 9 and FIG. 10. In this embodiment each selection plate 250, 252 has four apertures 250a, 250b, 250c, 250d or 252a, 252b, 252c, 252d, which are located at 90 degrees to each other.

A light transmission plate 254a is set in an aperture 250a in the first selection plate 250. A slit plate 255a, which is equivalent to the first slit plate 218 as shown in FIG. 2, is set in another aperture 250b, and a further slit plate 256a, which is equivalent to the first slit plate 218' as shown in FIG. 7, in another aperture 250c. A further slit plate 257a of different type is set in an aperture 250d. The first selection plate 250 is attached at the center thereof to a rotation shaft 259 of drive motor 258. When the controller 20 controls the drive motor 258 to rotate the first selection plate 250, either one of the light transmission plate 254a and the slit plates 255a, 256a, 257a is positioned in an optical path between the mirror 210 and the condenser lens 212 in the illumination optical system 202. When either the slit plate 255a or the slit plate 256a is located in the optical path, the longitudinal direction of slits therein becomes coincident with the direction normal to the plane of FIG. 8. When the slit plate 257a is located in the optical path, the longitudinal direction of slits therein becomes coincident with the direction parallel to the plane of FIG. 8. Also in this embodiment, when the first selection plate 250 is located in the optical path between the mirror 210 and the condenser lens 212, it is in the so-called tilting arrangement based on the Scheimpflug principle with the front surface of wafer W with respect to the image-forming optical system composed of the condenser lens 212 and the illumination objective 216.

A light transmission plate 254b is set in an aperture 252a in the second selection plate 252. Further, a slit plate 255b, which is equivalent to the second slit plate 232 as shown in FIG. 2, is set in another aperture 252b, and another slit plate 256b, which is equivalent to the second slit plate 232' as shown in FIG. 7, is set in another aperture 252c. Set in an aperture 252d is a slit plate 257b, which is the same or similar to the slit plate 257a set in the aperture 250d in the first selection plate 250. The second selection plate 252 is attached at the center thereof to a rotation shaft 261 of second drive motor 260. When the controller 20 controls the second drive motor 260 to rotate the second selection plate 252, either one of the light transmission plate 254b and the slit plates 255b, 256b, 257b is positioned in an optical path between the collimator lens 224 and the mirror 226 in the condenser optical system 204. In this case, the second drive motor 260 is synchronized with the first drive motor 258, so that when one of the light transmission plate 254a and the slit plate 255a, 256a and 257a in the first selection plate 250 is located in the optical path, one of the light transmission plate 254b and the slit plate 255b, 256b and 257b in the second selection plate 252 is located in the optical path, respectively. When the slit plate 255b or the slit plate 256b is located in the optical path, the longitudinal direction of slits therein becomes coincident with the direction normal to the plane of FIG. 8. When the slit plate 257b is located in the optical path, the longitudinal direction of slits therein becomes coincident with the direction parallel to the plane of FIG. 8. When the second selection plate 252 is located in the optical path between the collimator lens 224 and the mirror 226, it is in the so-called tilting relation based on the Scheimpflug principle with the front surface of wafer W with respect to the optical system composed of the condenser objective 222 and the collimator lens 224.

Such an arrangement facilitates the exchange of slit plates. Accordingly, the inclination detection can be done with high precision according to the characteristics of wafer, for example according to the reflectivity of back surface thereof. In addition, the light transmission plates 254a, 254b having no light shield portions can be placed in the illumination optical system 202 and in the condenser optical system 204, respectively, by rotating the selection plates 250, 252. This permits one to determine how the once-reflected light or twice-reflected light on the wafer back surface influences the inclination detection, whereby an optimum slit plate or the light transmissive plate can be selected. The following describes how to select a slit plate or the light transmissive plate.

First, a quantity of light through the light transmission plate 254a, a quantity of light through the slit plate 255a used for cutting off only the once-reflected light on the back surface, and a quantity of light through the slit plate 256a used for cutting off both the once-reflected light and the twice-reflected light on the back surface are respectively defined as "1", "a" and "b". The light quantities can be accurately measured with a silicon wafer or reference mark plate, which has no internal refraction, being located in place of the wafer W. Further, light quantities on the quartered photodetector 230 with the plate 254a, 255a, and 256a are respectively defined as $\alpha_0$, $\alpha_1$ and $\alpha_2$. Actually normalized light quantities $\beta_0$, $\beta_1$ and $\beta_2$ are as follows.

$$\beta_0 = \alpha_0 \quad (14)$$

$$\beta_1 = \alpha_1/a \quad (15)$$

$$\beta_2 = \alpha_2/b \quad (16)$$

The light quantity $\beta_0$ is a sum of the front-surface-reflected light, once-back-surface-reflected light and twice-back-surface-reflected light. Similarly, the light quantity $\beta_1$ is a sum of front-surface-reflected light and twice-back-surface-reflected light, and the light quantity $\beta_2$ is one of only the front-surface-reflected light. Then, a light quantity $\gamma_1$ of the once-back-surface-reflected light and a light quantity $\gamma_2$ of the twice-back-surface-reflected light are calculated as follows.

$$\gamma_1 = \beta_0 - \beta_1 \quad (17)$$

$$\gamma_2 = \beta_1 - \beta_2 \quad (18)$$

The influence of the back-surface-reflected light on the inclination detection can be checked by calculating a ratio of the light quantity $\gamma_1$ of once-back-surface-reflected light and the light quantity $\gamma_2$ of twice-back-surface-reflected light to the light quantity $\beta_0$ of the front-surface-reflected light. For example, if the influence appears in inclination detection with light quantity $\gamma_1$ or $\gamma_2$ exceeding 10% of light quantity $\beta_0$, the control is carried out such that if $(\gamma_1+\gamma_2)/\beta_0<0.1$ (10%) the light transmissive plates 254a, 254b are selected, that if $\gamma_1/\beta_0<0.1$ and $\gamma_2/\beta_0 0.1$ the slit plates 255a, 255b for cutting off the once-back-surface-reflected light are selected, or that if $\gamma_2/\beta_0<0.1$ the slit plates 256a, 256b for cutting off once and twice back-surface-reflected light are selected.

The slit plate 257a in the first selection plate 250 in FIG. 9 and the slit plate 257b in the second selection plate 252 in FIG. 10 may be used for detecting surface inclination, for example in case that an object is a semiconductor wafer with noback surface reflection and a certain circuit pattern is formed on the surface thereof. Also, in case that there are various wafers used, slit plates of different types may be further added to the selection plates 250, 252, according to the characteristics of wafer, for example according to the thickness thereof.

Figure 11:
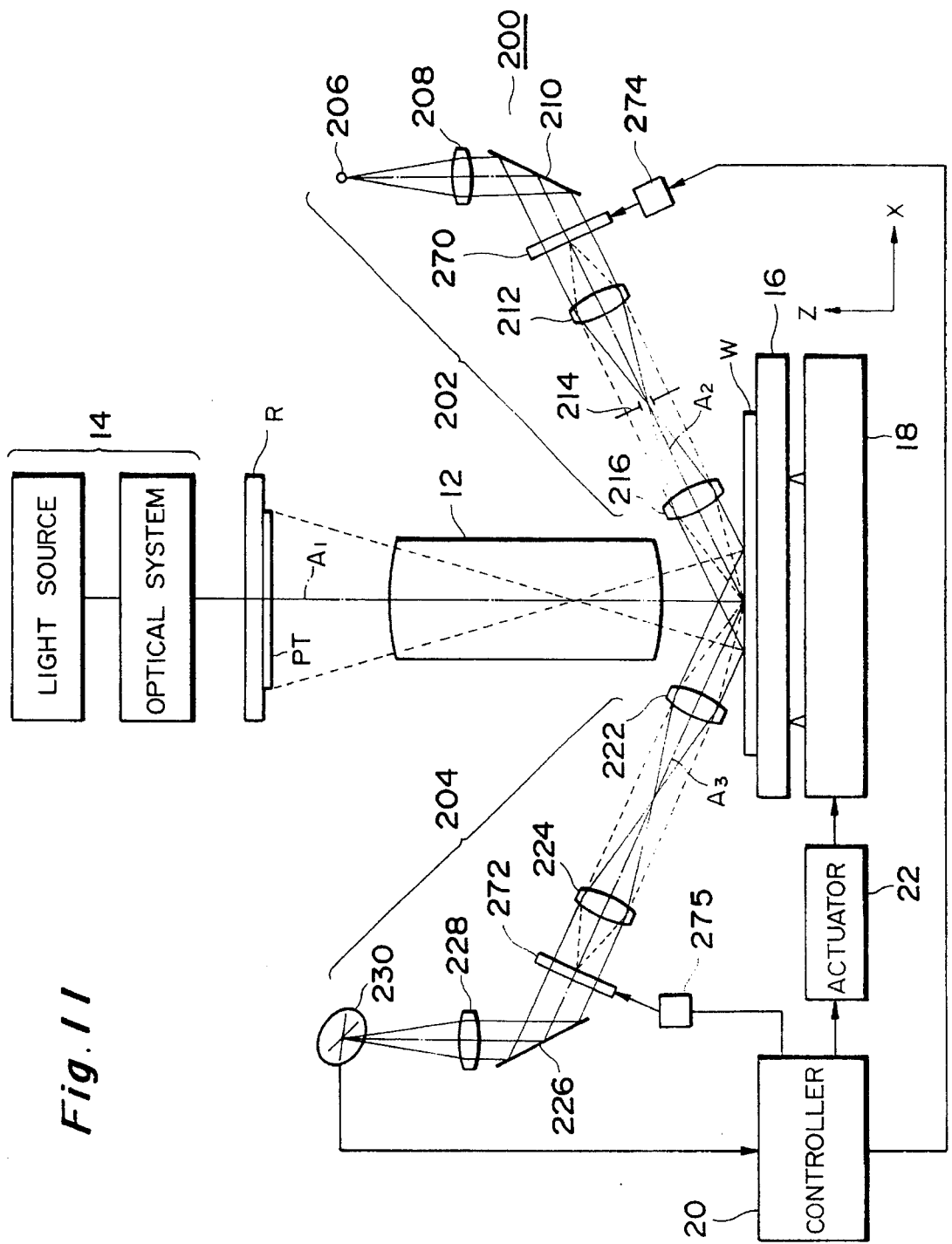
FIG. 11 schematically shows a fourth embodiment of the present invention.

FIG. 11 is a schematic optical path diagram in an embodiment obtained by modifying the embodiment shown in FIG. 8. The inclination detecting apparatus in the present embodiment is almost identical to the inclination detecting apparatus in the embodiment of FIG. 8 except that the first and second selection plates 250, 252 in the embodiment of FIG. 8 are replaced by first and second liquid crystal panels 270, 272 and that the setting way of the liquid crystal panels 270, 272 is modified.

In FIG. 11, the first liquid crystal panel 270 is arranged perpendicular to the optical axis $A_2$ between the mirror 210 and the condenser lens 212 in the illumination optical system 202. Also, the second liquid crystal panel 272 is arranged perpendicular to the optical axis $A_3$ between the collimator lens 224 and the mirror 226 in the condenser optical system 204.

Figure 12:
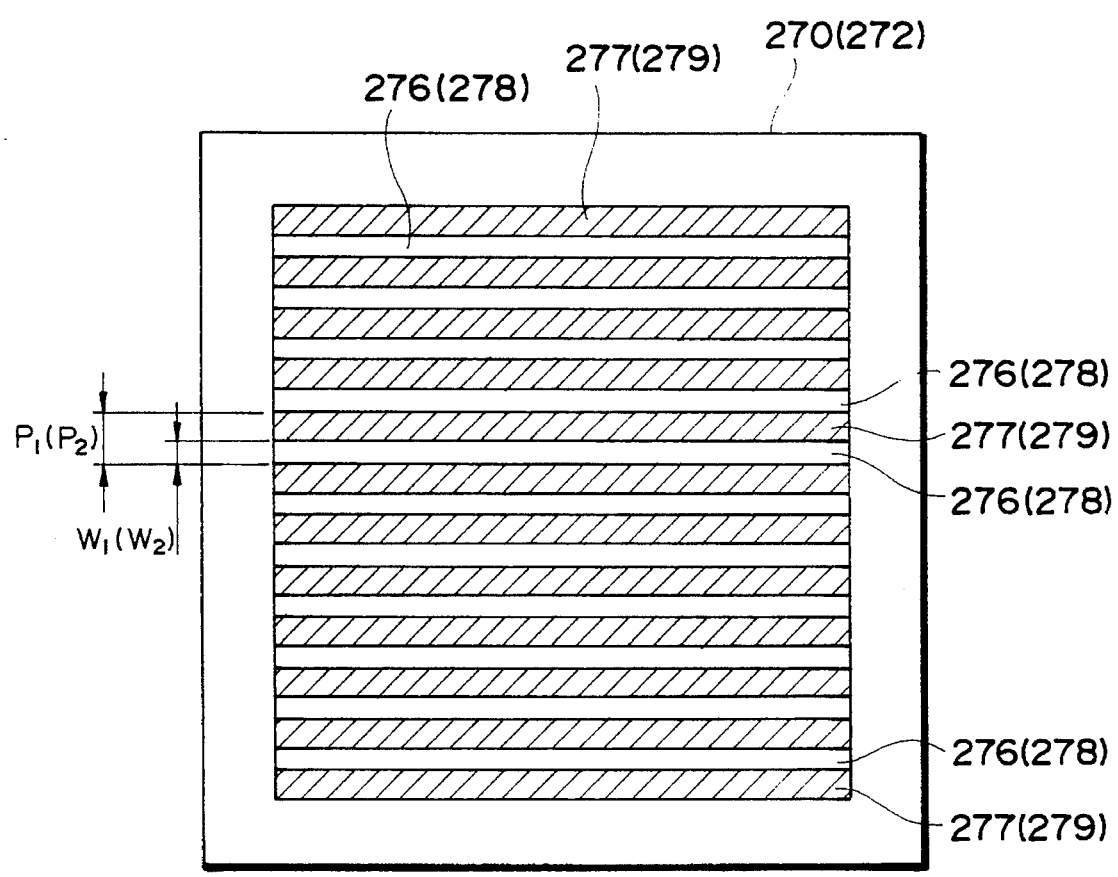
FIG. 12 is a plan view showing a liquid crystal panel used in the embodiment shown in FIG. 11.

FIG. 12 is a plan view showing the structure of liquid crystal panels 270, 272 used in the embodiment of FIG. 11. The liquid crystal panels 270, 272 are formed such that light-transmitting portions 276 (278) and light shield portions 277 (279) appear in the form of slits in a desired pattern when the controller 20 controls a voltage applied from each driver 274, 275 to each panel. FIG. 12 shows a state of the panel corresponding to the slit plate 218 (232) shown in FIG. 2. Namely, the light-transmitting portions 276 (278) are formed at pitch $p_1$ ($p_2$) in the direction conjugate with the X direction on the front surface of wafer W in FIG. 11 and in width $w_1$ ($w_2$), extending in the Y direction (in the direction normal to the plane of FIG. 11). Although not shown, the panels can produce a state corresponding to the slit plates 218' (232') shown in FIG. 7 by controlling the applied voltage. Also, the entire panels can turn to be transparent.

Returning to FIG. 11, the system is telecentric on the wafer W side but not telecentric on each liquid crystal panel side in respect of image-forming relation of the first liquid crystal panel 270 and the second liquid crystal panel 272 respectively disposed in the illumination optical system 202 and in the condenser optical system 204, and the liquid crystal panels 270, 272 are arranged perpendicular to the optical axes $A_2$, $A_3$, respectively. Accordingly, the setting plane of the first liquid crystal panel 270 is substantially conjugate with the front surface of wafer W, and the front surface of wafer W is substantially conjugate with the setting surface of the second liquid crystal panel 272. The other part of structure is substantially identical to that of the embodiment in FIG. 8.

In such an arrangement, since the liquid crystal panels 270, 272 are perpendicular to the respective optical axes $A_2$, $A_3$, the light-transmitting portions having constant pitch are imaged at constant pitch on the front surface of wafer W in each conjugate relation with the front surface of wafer W. The unsharpness at the periphery of projected image can be substantially ignored by making the light source 206 smaller. If the light-transmitting portions 276, 278 and the light shield portions 277, 279 in the liquid crystal panels 270, 272 are shaped in the same manner as the slit plates 218, 232 in FIG. 2, the once-reflected light from the back surface of wafer W can be removed as described above. Additionally, if the light-transmitting portions and the light shield portions in the liquid crystal panels 270, 272 are changed to those in the slit plates 218', 232' in FIG. 7 under the control of the controller 20, the once and twice back-surface-reflected light can be removed as shown in FIG. 6.

Strictly speaking, an image of each liquid crystal panel 270, 272 is perpendicular to the optical axis $A_2$, $A_3$ on the wafer W, but is not parallel to the front surface of wafer, as shown in FIG. 4 or FIG. 6. If the depth of focus can be increased with a smaller light source 206 as described above, the structure of the present embodiment can be assumed as identical to that in FIG. 4 or FIG. 6.

Employing the liquid crystal panels which can change the width and pitch of light-transmitting portions as described above, the inclination detecting apparatus according to the present invention can be used for a variety of wafers. It should be understood by those skilled in the art that display panels such as electrochromic devices can be used in place of the liquid crystal panels.

Figure 13:
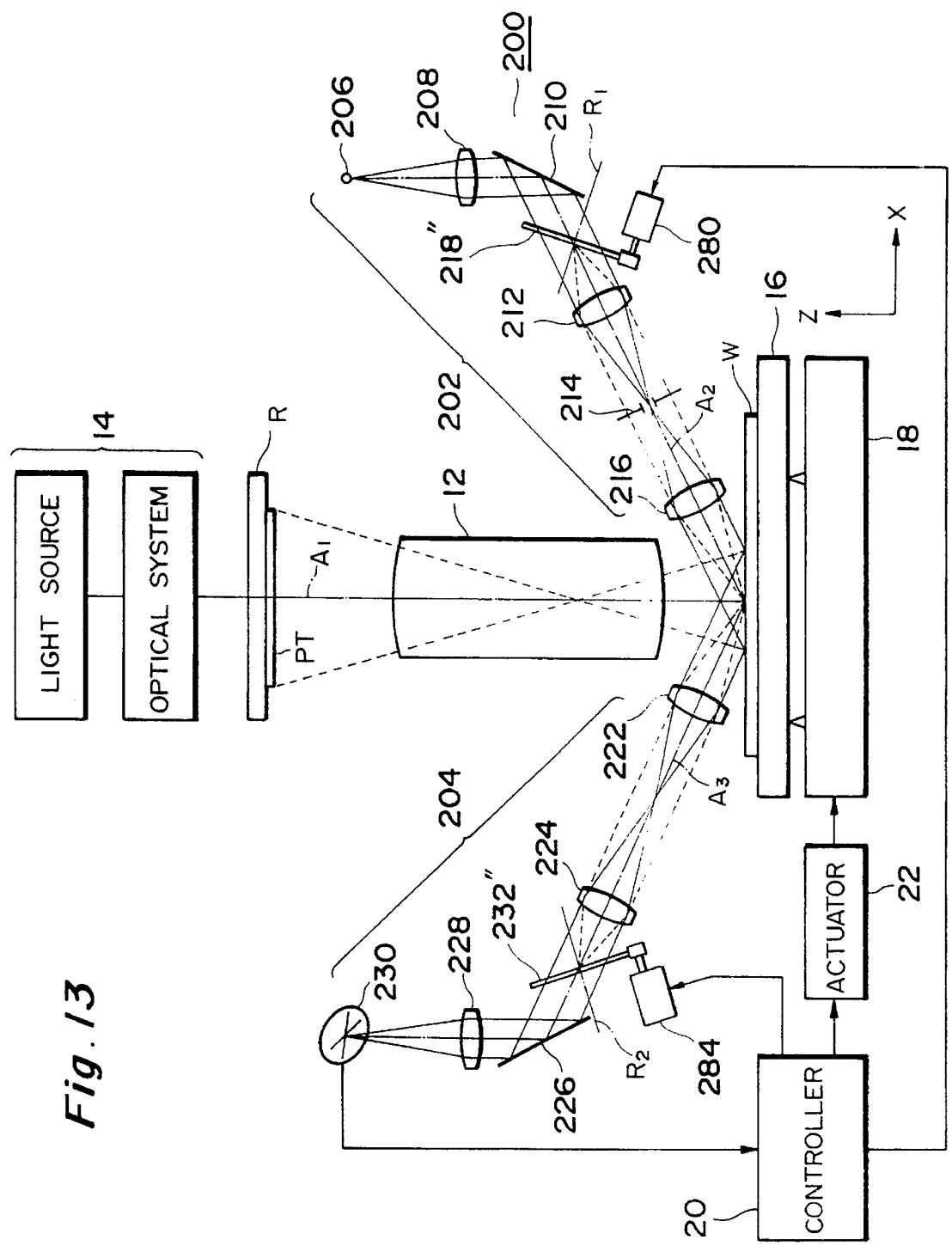
FIG. 13 schematically shows a fifth embodiment of the present invention.
Figure 14:
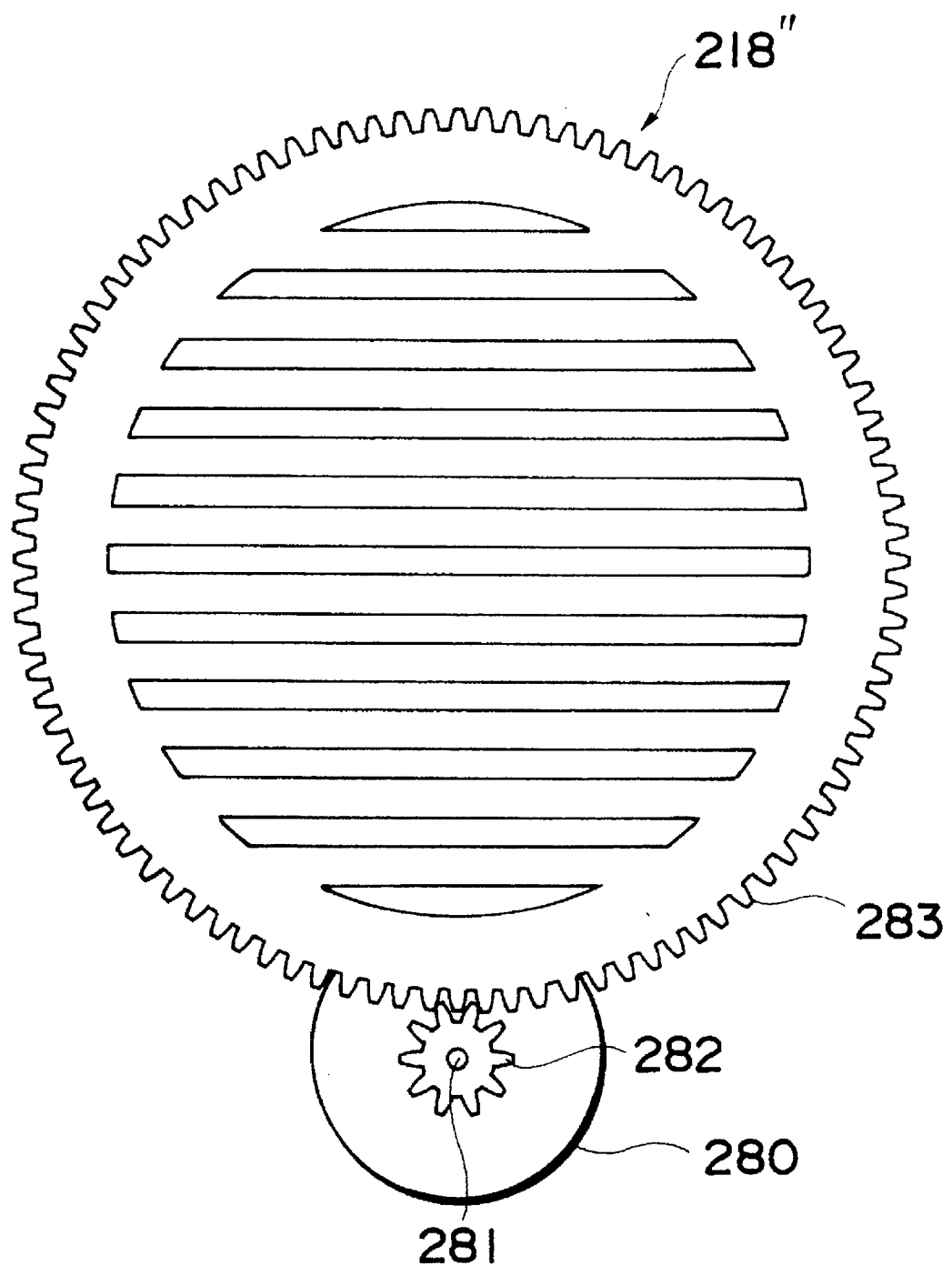
FIG. 14 is a plan view showing a slit plate and its drive mechanism used in the embodiment shown in FIG. 13.

FIG. 13 shows still another embodiment of the present invention. This embodiment is substantially the same as the embodiment shown in FIG. 1 except that first and second slit plates 218", 232" are rotatable in the circumferential direction. The first slit plate 218" is supported at the center as rotatable about a rotational axis $R_1$ parallel to the normal line to the surface of the first slit plate. For example as shown in FIG. 14, teeth 283 provided on the peripheral edge of slit plate 218" mesh with a gear 282 fixed on a rotation shaft 281 of a first drive motor 280. The first slit plate 218" is rotated about the rotational axis $R_1$ while controlling the first drive motor 280. Similarly, the second slit plate 232" is supported at the center as rotatable about a rotation axis $R_2$ parallel to the normal line thereto, which is rotated by a second drive motor 284.

The slit plates 218", 232" each are conjugate with the front surface of wafer W with respect to the illumination optical system 202 and the condenser optical system 204 and in the so-called tilting arrangement based on the Scheimpflug principle therewith. The longitudinal direction of slits in the first slit plate 218" is always set in parallel with that in the second slit plate 232".

Figure 15:
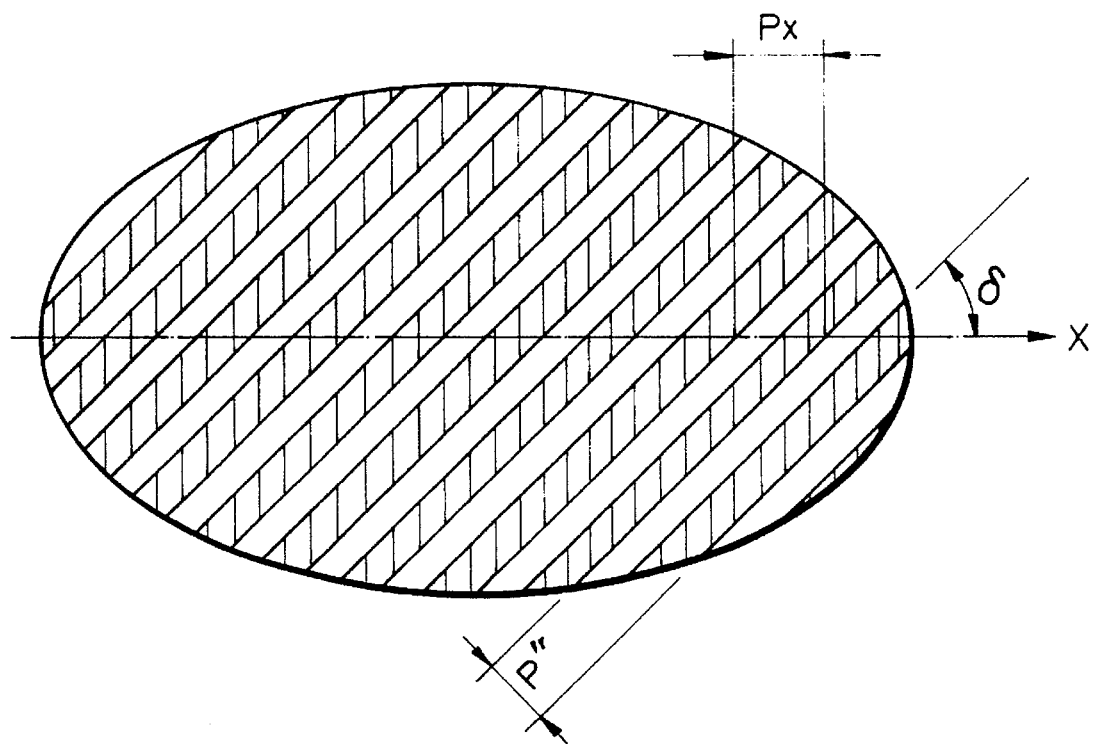
FIG. 15 schematically shows an image formed on the front surface of wafer in the embodiment shown in FIG. 13.

When the controller 20 controls the drive motors 280, 284 to rotate the slit plates 218", 232", the conjugate image on the front surface of wafer W is inclined relative to the incident direction or X direction (direction of intersecting line between the wafer W and the incident plane of illumination optical system 202) as shown in FIG. 15. The conjugate image as shown in FIG. 15 is composed of bright portions Ia and dark portions Ib. The bright portions Ia correspond to slits in the first and second slit plates 218", 232", while the dark portions Ib to light shield portions in the first and second slit plates 218", 232". If the pitch of bright portions Ia is p", the pitch in the X direction is $P_x$, and an angle of inclination of the conjugate image to the X direction is δ, the pitch $p_x$ is as follows.

$$p_x = p''/|\cos\delta| \tag{19}$$

It is apparent from Equation (19) that as the inclination angle δ, that is, the rotation angle of slit plates 218", 232" is changed the pitch $p_x$ can be continuously changed from p" to the infinity. Accordingly, this embodiment is ready for wafers with any thickness.

If the thickness d of wafer W is preliminarily obtained by a thickness sensor or the like, the pitch $p_x$ can be determined by the following equation.

$$p_x \geq \frac{2d}{\sqrt{n^2/\sin^2\theta_1 - 1}} \tag{20}$$

In the above equation, n represents an index of refraction of wafer W, and $\theta_1$ represents an incident angle of light from the illumination optical system into the wafer W.

This permits inclination detection of various wafers W with different thicknesses while keeping the opening rate of slit plates 218", 232" as high as possible.

Figure 16:
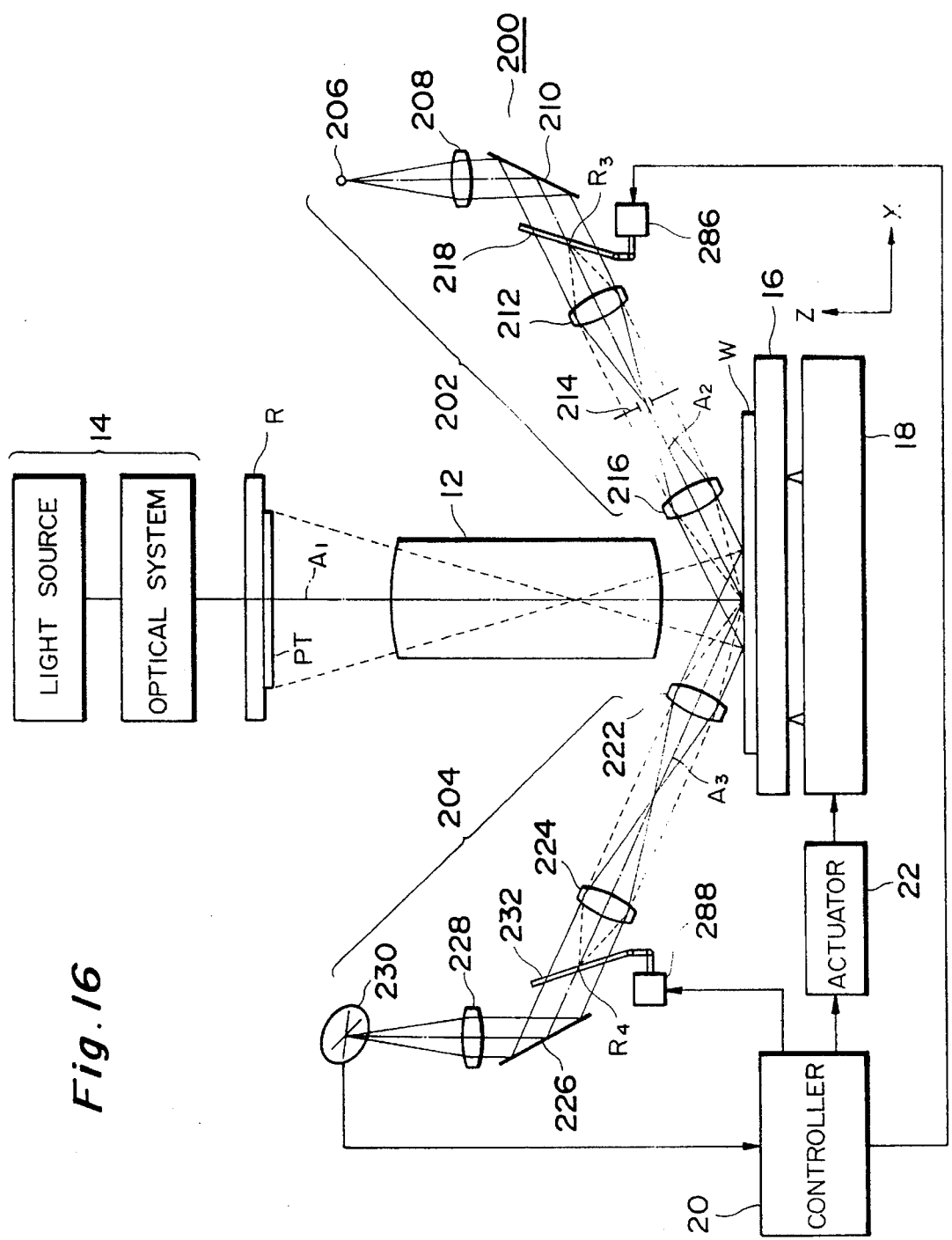
FIG. 16 schematically shows a sixth embodiment of the present invention.

There are methods for changing the pitch of bright portions in the conjugate image on wafer, other than the method for rotating the slit-plates in the circumferential direction. For example, as shown in FIG. 16, there is a method for rotating the first and second slit plates 218, 232 about rotation axes $R_3$, $R_4$ extending in parallel with the axis normal to the incident plane, that is, in the Y direction. Since the slits 220, 234 in the first and second slit plates 218, 232 extend in the Y direction, the pitch of bright portions in the conjugate image formed on the front surface of wafer W can be changed with necessity by swinging the slit plates 218, 232 about the rotational axes $R_3$, $R_4$ by means of drive motors 286, 288 or the like. Accordingly, this embodiment is also effective for inclination detection of various wafers W with different thicknesses while keeping the opening rate of slit plates 218, 232 as high as possible. Although the slit plates 218, 232 do not always satisfy the condition of Scheimpflug principle, unsharpness of image at the periphery thereof can be substantially ignored with a smaller light source 206.

Figure 17:
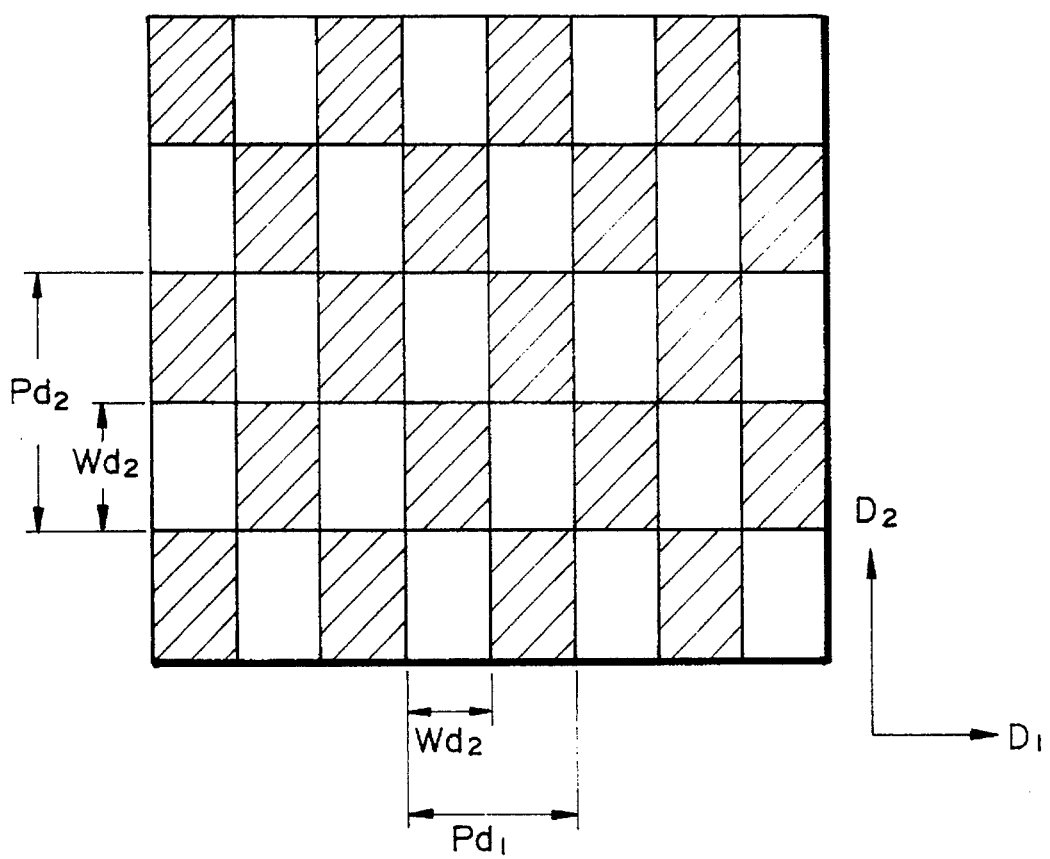
FIG. 17 is a plan view showing a back-surface-reflected-light remover with checkered pattern applicable in the present invention.

FIG. 17 shows a plate 290 for removing the back-surface-reflected light, which can replace the first and second slit plate 218, 232 in the embodiment shown in FIG. 1. This plate 290 is formed in a checkered pattern (like a chessboard) of light-transmitting portions 292 and light shield portions 293. In FIG. 17, the pitch $pd_1$ and width $wd_1$ of light-transmitting portions 292 in the direction of arrow $D_1$ are different from the pitch $pd_2$ and width $wd_2$ of light-transmitting portions 292 in the direction of arrow $D_2$ perpendicular to the arrow $D_1$.

Such plates 290 are placed at the positions of the first and second slit plates 218, 232 in FIG. 1 and supported at the center as rotatable about rotational axes parallel to the axis normal to the surface of each plate 290, though the arrangement is omitted to depict. The pitch of bright portions in the image formed on the front surface of wafer W in the X direction is different between in case of the $D_1$ direction of plate 290 being made coincident with the Y direction in FIG. 1 and in case of the $D_2$ direction being made coincident with the Y direction. This arrangement is effective for two types of wafers.

All the embodiments as described above are for enabling the detection of whether the exposure area on the front surface of wafer through the projection objective 12 is perpendicular to the optical axis $A_1$ of projection objective 12. However, when the image of pattern PT on reticle R is projected onto the wafer W through the projection objective 12, there are cases in which the wafer w is intentionally inclined at a fine angle to the plane normal to the optical axis $A_1$ in order to superimpose an image on patterns already exposed and transferred onto the wafer W. In such cases, what should be detected is whether a portion of front surface of wafer W as object is parallel to the image plane of the projection objective 12.

Again referring to FIG. 1, supposing the front surface of wafer W is deviated outside the permissible range from the best focus plane as to the position along the optical axis $A_1$ of the projection objective 12 (position in the Z direction), among the detection light passing through the first slit plate 218 all reflected light from the wafer front surface cannot pass through the slits in the second slit plate 232. The light reflected by the back surface of wafer W could pass through the slits in the second slit plate 232, whereby an error could be caused in inclination detection of wafer front surface relative to the best focus plane. Then, if the actual exposure sequence is arranged such that the focusing position adjustment of the front surface is carried out after the inclination detection of front surface of wafer W is completed, the inclination detection result could include an error.

Further, in case that the optical focus position detecting apparatus 100 as described above is used to detect the focus position of the front surface of glass wafer W, if the intensity is high of the light reflected by the back surface of wafer W, the reflected light from the back surface could not be discriminated from that from the front surface. Therefore, there is a possibility to complete positioning of wafer W in the Z direction with the reflected light from the back surface of wafer W in the state that the back surface of wafer W is on the best focus plane of the projection objective 12.

Thus, the focus position detecting apparatus and the inclination detecting apparatus should be preferably operated in the following order in case that the object is a transparent wafer.

First described is the structure and the operation of the optical focus position detecting apparatus 100 shown in FIG. 1.

In the focus position detecting apparatus 100 in FIG. 1, the detection light from a light source 108 illuminates a first slit plate 102. A slit 104 is formed in the first slit plate 102 as extending in the direction (Y direction) normal to the plane of FIG. 1. The detection light passing through the slit 104 in the first slit plate 102 is focused through an objective 110, the optical axis $A_4$ of which is greatly inclined relative to the optical axis $A_1$, on the front surface or upper surface of glass wafer W while obliquely projecting an image of slit 104 in the first slit plate 102 onto the central portion in the exposure area on the front surface of wafer W. The longitudinal direction of the image of slit 104 thus projected is the direction normal to the plane of FIG. 1.

After the detection light is reflected by the front surface and the back surface of wafer W, it is focused on a second slit plate 114 through an objective 112 so that the image of slit 104 projected onto the front surface of wafer W is re-imaged in the vicinity of slits in the second slit plate 114. The optical axis $A_5$ of the objective 112 is inclined symmetric with the optical axis $A_4$ of the objective 110 with respect to the optical axis $A_1$ of the projection optical system or projection objective 12. The longitudinal direction of a slit 116 in the second slit plate 114 is also normal to the plane of FIG. 1. The second slit plate 114 is supported by a vibrator 118 so that the second slit plate 114 vibrates at certain frequency in the direction R2 normal to the longitudinal direction of slit 116.

The detection light passing through the slit 116 in the second slit plate 114 enters a light receiving plane of photodetector 106. The operation of vibrator 118 is controlled by the controller 20, and photoelectrically converted signals are supplied from the photodetector 106 to the controller 20. The controller 20 obtains focus signals by synchronously commutating the photoelectrically converted signals from the photodetector 106 with drive signals of vibrator 118. In this case, the second slit plate 114 is positioned in the direction R2 such that the image of slit 104 in the first slit plate 102 is made coincident with the vibration center of slits 116 in the second slit plate 114 in the state that the front surface of wafer W is coincident with the best focus plane of projection objective 12.

When the front surface of wafer W is offset from the best focus plane of projection objective 12 in the Z direction, the image of slit 104 in the first slit plate 102 is shifted on the second slit plate 114 in the direction $R_2$ to change the level of focus signals obtained by the synchronous commutation of photoelectrically converted signals from the photodetector 106. By this, an amount of positional deviation in the Z direction can be detected for the detection area in the front surface of wafer W (projection area of image of slit 104) from the best focus plane of projection objective 12. The controller 20 adjusts the Z-directional position of the Z stage in the wafer stage 18 through the actuator 22 so as to obtain focus signals at a certain level (for example 0), whereby the detection area in the front surface of wafer W is made fit to the best focus plane of projection objective 12.

Since a glass wafer W gives reflection on the back surface, the back surface of wafer W could be made fit with the best focus plane of projection objective 12 if the Z-directional position (focus position) is controlled based on focus signals obtained by simply processing the photoelectrically converted signals from the photodetector 106.

Figure 18:
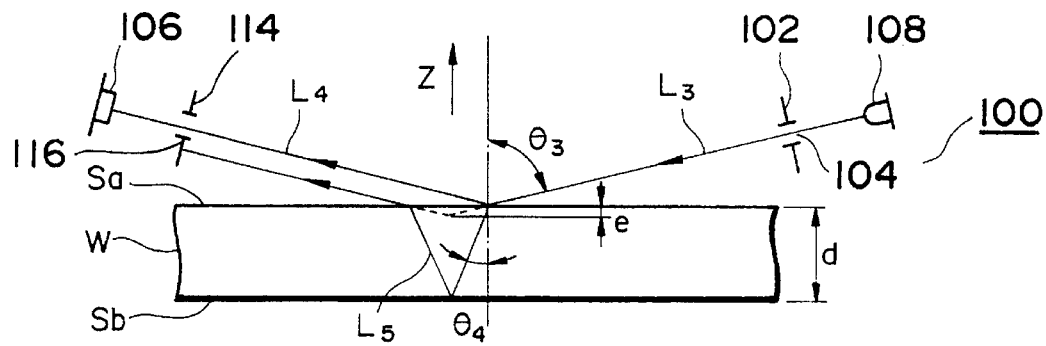
FIG. 18 schematically shows the relation between wafer and optical paths in the optical focus position detector shown in FIG. 1.

FIG. 18 shows a positional relation between glass wafer W and focus position detecting apparatus 100. In FIG. 18, a part of principal ray $L_3$ of detection light passing through the slit 104 in the first slit plate 102 is reflected by the front surface Sa of wafer W and a principal ray $L_4$ of the reflected light goes to the second slit plate 114. The rest of principal ray $L_3$ is refracted and directed to the back surface Sa, and a principal ray $L_5$ reflected by the back surface Sb goes to the second slit plate 114 in parallel with the principal ray $L_4$ from the front surface Sa.

In this case, the following equation gives an apparent depth e of the back surface Sb of wafer W from the front surface Sa as observed from the second split plate 114.

$$e = d \cdot \tan\theta_4 \cdot \tan(90° - \theta_3) \quad (21)$$

Where n is an index of refraction of wafer W, d the thickness thereof, $\theta_3$ an incident angle of principal ray $L_4$, and $\theta_4$ an angle of refraction of refracted principal ray $L_5$. Also, the angle of refraction $\theta_4$ can be determined as follows by the well-known law of refraction.

$$n = \sin\theta_3 / \sin\theta_4 \quad (22)$$

For example, if the thickness d of wafer W is 1 mm, the incident angle $\theta_3$ is 80°, and the index of refraction n is 1.5, then $\theta_4 = 41°$ from Equation (22). Further, the apparent depth e is calculated by Equation (21), obtaining the following result.

$$e = 0.15 \text{ [mm]}$$

This means that the principal ray $L_4$ of the reflected light by the front surface Sa of wafer W is separated from the principal ray $L_5$ of the reflected light by the back surface Sb of wafer W by about 0.15 mm in the direction normal to the longitudinal direction of slit 116 on the second slit plate 114, and that the reflected light from the back surface Sb has an intensity enough to be detected by the photodetector 106. Once the focus positioning is done with reference to the front surface Sa of wafer W, the focus position is rarely deviated greatly and the focus is kept fit with the front surface Sa. Further, if the position of the Z stage in the wafer stage 18 is not moved upon exchange of wafer W and if unevenness of thickness of wafer W is smaller than the apparent depth e of back surface Sb to the front surface Sa, the focus positioning will not be carried out with reference to the back surface Sb.

Accordingly, if exposure is made only on a single wafer W, it suffices that the detection area in the front surface Sa of wafer W is made fit to the best focus plane of projection objective 12 in a first exposure shot. Further, if the thickness variation is small for wafers W in a lot, it suffices that the detection area in the front surface of wafer W is made fit to the best focus plane of projection objective 12 in a first exposure shot on a first wafer in the lot.

Figure 19:
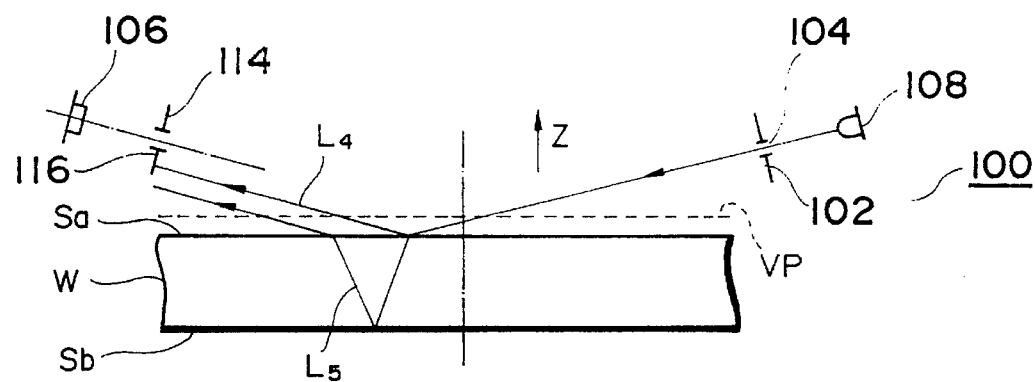
FIG. 19 is an explanatory drawing showing a focusing method in which a wafer is made gradually approaching a projection optical system.

Next described is the total operation in exposure on a single glass wafer W in this example. Initially, when exposure is performed in a first shot area on the wafer W, the Z stage in the wafer stage 18 of FIG. 1 is lowered down to the lowermost position, where the Z stage is most distant from the projection objective 12. This causes the front surface Sa of wafer W to be located below the best focus plane VP of projection lens 12, as shown in FIG. 19. Thus, the detection light passing through the first slit plate 102 is reflected such that the principal ray $L_4$ of light reflected by the front surface Sa of wafer W and the principal ray $L_6$ of light reflected by the back surface Sb both are deviated from the slit 116 in the second slit plate 114 toward the wafer w.

The Z stage in the wafer stage 18 of FIG. 1 is raised from this state so that the front surface Sa of wafer W gradually approaches the best focus plane VP. As the Z stage ascends, the principal ray $L_4$ of the reflected light from the front surface Sa of wafer W first reaches the vibration center of slit 116 in the second slit plate 114 so as to make the detection area in the front surface Sa fit to the best focus plane VP to determine the focus position. Then, while the focus position is fixed on the front surface Sa of wafer W, the controller 20 in FIG. 1 detects an inclination angle of the front surface Sa of wafer W relative to the best focus plane VP, based on four photoelectrically converted signals from the photodetector 230 in the inclination detecting apparatus 200, and performs leveling of wafer W through the wafer stage 18 so as to make the inclination angle be zero.

Since the entire exposure area in the front surface Sa of wafer W is located in the vicinity of the best focus plane VP in this case, the first slit plate 218 and the second slit plate 232 function to prevent the reflected light from the back surface Sb of wafer W from entering the photodetector 230, whereby accurate leveling can be made. After that, the exposure is carried out through the projection lens 12 for replicating the pattern PT on reticle R in a first shot area on the wafer W.

Then the exposure is continued for remaining shot areas on the wafer W. The exposure is performed in each shot area after leveling therefor while the focus position is kept fixed after the first shot area.

As described above, the present embodiment is so arranged that the focusing is carried out as the front surface Sa of wafer W is made gradually approaching the projection lens 12 from the state in which the front surface Sa of wafer W is preliminarily separated away from the best focus plane VP, which permits sure detection of focus position with reference to the front surface Sa of wafer W. Therefore, thereafter the inclination detecting apparatus 200 can accurately perform the leveling of the front surface Sa of wafer W.

Figure 20:
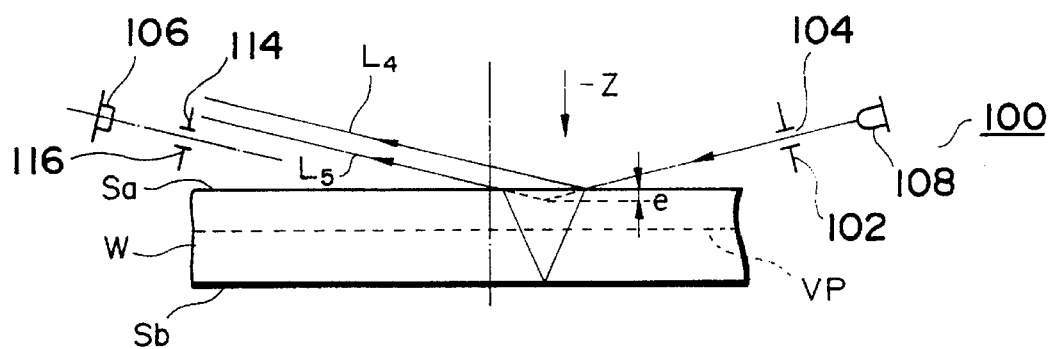
FIG. 20 is an explanatory drawing showing a focusing method in which a wafer is made gradually receding from a projection optical system.

In contrast with the above embodiment, there is such a method considered that after the front surface Sa of wafer W is preliminarily moved inwardly of the best focus plane VP and that the focusing is carried out as the wafer W is made receding from the projection lens 12. In this case, an initial state is, as shown in FIG. 20, that the front surface Sa of wafer W and the plane of apparent depth e corresponding to the back surface Sb both are located above the best focus plane VP of the projection lens 12. Then, the detection light passing through the first slit plate 102 is reflected such that the principal ray $L_4$ of the reflected light from the front surface Sa of wafer W and the principal ray $L_5$ of the reflected light from the back surface Sb both are deviated from the slit 116 in the second slit plate 114 toward the projection lens 12.

The Z stage in the wafer sage 18 of FIG. 1 is lowered from this state such that the front surface Sa of wafer W gradually approaches the best focus plane VP. As the Z stage descends, the principal ray $L_5$ of the reflected light from the back surface Sb of wafer W first reaches the vibration center of slit 116 in the second slit plate 114. A focus signal in this occasion is ignored and the wafer W is further lowered. Then, when the principal ray $L_4$ of the reflected light from the front surface Sa of wafer W reaches the vibration center of slit 116 in the second slit plate 114, a focus signal obtained is made effective to make the detection area in the front surface Sa fit to the best focus plane VP and then to stop the movement of Z stage. Then the inclination detection is carried out in such a state. The inclination detection and leveling is accurately done, since the reflected light from the back surface Sb is effectively cut off.

Even though the first slit plate 218 and the second slit plate 232 are initially accurately positioned in FIG. 1, the position of best focus plane of projection objective 12 could change with time or the positional relation could be changed between the first slit plate 218 and the second slit plate 232. Then the second slit plate 232 needs to be re-adjusted in position. That is, calibration is necessary for the inclination detecting apparatus 200.

For that purpose, the present embodiment is arranged as follows. First, while a detection area in the front surface Sa of wafer W is made fit with the best focus plane of projection lens 12, the second slit plate 232 is positioned in the direction R1 to maximize a sum signal of four photoelectrically converted signals from four light-receiving segments in the photodetector 230. In this state, almost all of rays reflected by the front surface Sa of wafer W enter the slit 234 in the second slit plate 232. An actuator (for example a mechanism for driving a micrometer by a motor) may be provided for finely moving the second slit plate 232 in the direction R1. Using the actuator, the calibration can be automatically done by positioning the second slit plate 232 as to maximize the sum signal of photoelectrically converted signals from the photodetector 230.

Also, since a reference mark plate for various alignments is provided on the wafer holder 16 of FIG. 1, the calibration can be made using the front surface of the reference mark plate. Further, since a transparent wafer W is affected by the back-surface reflection, an opaque substrate such as a silicon wafer may be employed only for calibration. With opaque substrate, calibration can be accurately carried out without any back surface reflection.

Further, the second slit plate 232 may be formed for example by an electrochromic device or a liquid crystal panel. In more detail, the relation between light-transmitting portions and light shield portions can be changed by the electrochromic device while keeping the same effect as that obtained when the second slit plate 232 is moved in the direction R1.

It should be noted that the inclination detecting apparatus according to the present invention is not limited to applications in the reduction projection exposure apparatus as shown in the above embodiments, but can be employed in other applications, for example in inspecting an object through a microscope. In this example, a beam for inclination detection is of course guided to illuminate an observation area observed through the microscope, on an observation surface of the object.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. An inclination detecting apparatus for detecting an inclination of an object relative to a plane which a predetermined reference axis crosses, comprising:

an illumination optical system having a first optical axis obliquely set to said reference axis, said illumination optical system supplying a collimated beam onto a front surface of the object along a direction oblique to said reference axis;

a condenser optical system having a second optical axis arranged symmetric with said first optical axis of said illumination optical system with respect to said reference axis, said condenser optical system having a condensing member for condensing the collimated beam supplied from said illumination optical system and then reflected by the front surface of the object, and a light receiving member for receiving the beam condensed by said condensing member and generating a position signal corresponding to a light receiving position;

inclination detecting system for detecting an inclination of the front surface of the object, base on the position signal generated from said light receiving member;

first light limiting member having a light-transmitting portion and a light shield portion, said first light limiting member being disposed on the first optical axis of said illumination optical system such that a conjugate image thereof is formed on the front surface of the object arranged substantially perpendicular to said reference axis, and second light transmitting member having a light-transmitting portion and a light shield portion, said second light transmitting member being disposed on the second optical axis of said, condenser optical system such that a conjugate image thereof is formed on the front surface of the object arranged substantially perpendicular to said reference axis and that the conjugate image of said second light limiting member is substantially coincident with the conjugate image of said first light limiting member.

2. An inclination detecting apparatus according to claim 1, wherein said first light limiting member and said second light limiting member are located at respective positions based on the Scheimpflug principle with respect to the front surface of the object arranged substantially perpendicular to said reference axis.

3. An inclination detecting apparatus according to claim 1, wherein the object is transparent, and the light-transmitting portion and the light shield portion of said first light limiting member and the light-transmitting portion and the light shield portion of said second light limiting member are arranged such that said light shield portion of the second light limiting member can cut off light reflected by the back surface of the object arranged substantially perpendicular to said reference axis.

4. An inclination detecting apparatus according to claim 3, wherein said first and second light limiting members are first and second slit plates, respectively, in which a plurality of slits are arranged as the light-transmitting portion in parallel with each other and at a predetermined pitch, said slit plates each being arranged such that a longitudinal axis of said slits in each slit plate crosses an incident plane including said first optical axis of said illumination optical system and said second optical axis of said condenser optical system.

5. An inclination detecting apparatus according to claim 4, wherein an opening rate, which is a ratio of a width of each slit to the pitch of the slits in each of the first and second slit plates, is in the range of from 10% to 50%.

6. An inclination detecting apparatus according to claim 4, wherein said first and second slit plates each are rotatable about a rotation axis extending in the incident plane including said first optical axis of said illumination optical system and said second optical axis of said condenser optical system.

7. An inclination detecting apparatus according to claim 4, wherein said first and second slit plates each are swingable about a rotation axis extending normal to the incident plane including said first optical axis of said illumination optical system and said second optical axis of said condenser optical system.

8. An inclination detecting apparatus according to claim 1, wherein each of said first and second light limiting means is a plate of a checkered pattern in which light-transmitting portions and light shield portions are alternately arranged along a first direction and a second direction perpendicular to each other; wherein each of said plates is formed such that a pitch and a width of the light-transmitting portions in the first direction are different from those in the second direction; and wherein each of said plates is arranged as changeable in position such that said first direction or second direction becomes parallel to an axis normal to the incident plane including said first optical axis of said illumination optical system and said second optical axis of said condenser optical system.

9. An inclination detecting apparatus according to claim 1, further comprising:

first exchange system for exchanging the first light limiting member set on the first optical axis of said illumination optical system for a third light limiting member different in arrangement of the light-transmitting portion and the light shield portion therefrom; and second exchange member for exchanging the second light limiting member set on the second optical axis of said condenser optical system for a fourth light limiting member different in arrangment of the light-transmitting portion and the light shield portion therefrom, wherein said third and fourth light limiting member are so arranged as to remove undesirable reflected light from a object having characteristics different from those of the object to which said first and second light limiting member are applied.

10. An inclination detecting apparatus according to claim 9, further comprising means for selecting either said first and second light limiting member or said third and fourth light limiting member for an object, based on a change in signal output from said light receiving member upon change between the arrangement in which said first and second light limiting members are set on the first and second optical axes, respectively, and the arrangement in which said third and fourth light limiting members are set on the first and second optical axes, respectively.

11. An inclination detecting apparatus according to claim 9, wherein said first exchange system is a first selection plate having the first light limiting member and the third light limiting member, said first selection plate being capable of selectively setting either one of said first and third light limiting members on the first optical axis of said illumination optical system; and wherein said second exchange system is a second selection plate having the second light limiting system and the fourth light limiting member, said second selection plate being capable of selectively setting either one of said second and fourth light limiting members on the second optical axis of said condenser optical system.

12. An inclination detecting apparatus according to claim 1, wherein each of said first and second light limiting members is a display which can change the lighttransmitting portion and the light shield portion depending upon a voltage applied thereto and wherein said inclination detecting apparatus further comprises means a control system for controlling the voltage applied to said display.

13. An inclination detecting apparatus according to claim 12, further comprising a system for determining the arrangement of the light-transmitting portion and the light shield portion for an object, based on a change in signal output from the light receiving member, said change in signal occurring upon a change of arrangement of the light-transmitting portion and the light shield portion.

14. An inclination detecting apparatus according to claim 12, wherein said display is a liquid crystal panel.

15. An inclination detecting apparatus according to claim 12, wherein said display is an electrochromic display.

16. An inclination detecting apparatus according to claim 1, further comprising:

a support system for supporting the object, said support system being arranged to adjust a position of the object in a direction parallel to said reference axis, a position of the object in two directions normal to said reference axis and perpendicular to each other, and an inclination of the object relative to said plane which said reference axis crosses; and a control system for controlling said support system such that the front surface of the object supported by said support system becomes perpendicular to said reference axis, based on a result of detection by said inclination detecting system.

17. A projection type exposure apparatus comprising:

a projection optical system for projecting a pattern formed on a mask, onto a photosensitive substrate;

a support system for supporting the substrate, said support system being arranged to adjust a position of the substrate in a direction parallel to a first optical axis of said projection optical system, a position of the substrate in two directions normal to said first optical axis and perpendicular to each other, and an inclination of the substrate relative to a plane which said first optical axis crosses;

an inclination detecting system for detecting an inclination of a front surface of the substrate supported by said support system; and a control system for controlling said support system such that the front surface of the substrate supported by said support system becomes substantially parallel to a focus plane of said projection optical system, based on a result of detection by said inclination detecting system;

wherein said inclination detecting system includes: an illumination optical system having a second optical axis obliquely arranged to said first optical axis, said illumination optical system supplying a collimated beam onto the front surface of the substrate in a direction oblique to said first optical axis;

a condenser optical system having a third optical axis arranged symmetric with said second optical axis of said illumination optical system with respect to said first optical axis, said condenser optical system having a condensing member for condensing the collimated beam supplied from said illumination optical system and then reflected by the front surface of the substrate, and a light receiving member for receiving the beam condensed by said condensing member and generating a position signal corresponding to a light receiving position;

a system for detecting an inclination of the front surface of the substrate, based on the position signal generated from said light receiving member;

a first light limiting member having a light-transmitting portion and a light shield portion, said first light limiting member being set on the second optical axis of said illumination optical system such that a conjugate image thereof is formed on the front surface of the substrate placed substantially perpendicular to said first optical axis; and a second light limiting member having a light-transmitting portion and a light shield portion, said second light limiting member being set on the third optical axis of said condenser optical system such that a conjugate image thereof is formed on the front surface of the substrate placed substantially perpendicular to said first optical axis and that the conjugate image of said second light limiting member is substantially coincident with the conjugate image of said first light limiting member.

18. A projection exposure apparatus according to claim 17, wherein the substrate is transparent, and said light-transmitting portion and light shield portion of said first light limiting member and said light-transmitting portion and light shield portion of said second light limiting member are arranged such that said light shield portion of said second light limiting member can cut off light reflected by the back surface of the substrate placed substantially perpendicular to said first optical axis.

19. A projection type exposure apparatus according to claim 18, wherein the substrate is a transparent wafer.

20. An inclination detecting method for detecting an inclination of a front surface of a transparent object comprising the steps of:

providing an inclination detecting apparatus for detecting an inclination of a transparent object relative to a plane which a predetermined reference axis crosses, said inclination detecting apparatus comprising a first light limiting means having a light-transmitting portion and a light shield portion, said first light limiting means having a conjugate image formed on said front surface of said object; and a second light limiting means having a light-transmitting portion and a light shield portion, said second light limiting means having a conjugate image formed on said front surface of said object, said conjugate image of said second light limiting means being substantially coincident with said first light limiting means, wherein said light-transmitting portion and light shield portion of said first light limiting means and said light-transmitting portion and light shield portion of said second light limiting means are arranged such that said light shield portion of said second light limiting means can cut off light reflected by a back surface of said object arranged substantially perpendicular to said reference axis;

providing an optical position detecting apparatus for detecting a position of said front surface of said object in a direction parallel to said reference axis;

detecting a position of said front surface of said object in said direction, using said position detecting apparatus;

moving said front surface of said object to a reference position in a first direction for measuring an inclination of said front surface of said object of said inclination detecting apparatus, based on a result of detection by said position detecting apparatus; and detecting an inclination of said front surface of said object, using said inclination detecting apparatus, in the state in which said front surface of said object is set at said reference position.

21. An inclination detecting method according to claim 20, wherein after said front surface of the object is substantially taken away from said reference position, the object is made gradually approaching said reference position.

22. An apparatus for detecting an inclination of a substrate relative to a reference surface comprising:

an illumination system for obliquely illuminating a collimated beam of light onto said substrate and projecting a pattern having dark portions and bright portions onto said substrate.

a condenser system for condensing the collimated beam reflected by said substrate and forming an image of said pattern on a predetermined plane, a light limiting member disposed on said predetermined plane for substantially shielding dark portions of said pattern image, and a photodetector for receiving light from bright portions of said pattern image, and a photodetector for receiving light from bright portions of said pattern image.

23. An apparatus according to claim 22, wherein said illumination system includes a light limiting member having a plurality of slits and disposed on a plane which is substantially conjugate with said substrate, and illumination system being adapted to form an image of said slits onto said substrate.

24. An apparatus according to claim 22, further comprising a system for changing a width of each dark portion of the image of said pattern on said substrate along an arrangement direction of the dark portions and changing a width of each light shield portion of laid light limiting member along an arrangement direction of the light shield portions.

25. An apparatus according to claim 22, further comprising an exposure system including a projection optical system for projecting a pattern formed on a mask, onto said substrate.

26. A method for detecting an inclination of a substrate onto which a first pattern is projected by a projection optical system to form an image of said first pattern on said substrate, comprising:

a step of illuminating a beam of light onto said substrate and photoelectrically detecting the beam reflected by said substrate, thereby detecting a position of said substrate in a direction of an optical axis of said projection optical system, a step of moving said substrate in said direction to match said substrate with an image surface of said projection optical system, based on the detected position, and a step of projecting a second pattern having dark portions onto said substrate, condensing light reflected by said substrate to form an image of said second pattern, substantially shielding the dark portions of said second pattern image, and receiving light from the bright portions of said second pattern image to detect an inclination of said substrate.

27. A method according to claim 26, further comprising:

a step of slanting said substrate, based on the detected inclination, so that said substrate is substantially parallel to said image surface, and a step of exposing said substrate with an image of said first pattern by said projection optical system.

* * * * *